US011127931B2

(12) United States Patent
Yoo et al.

(10) Patent No.: US 11,127,931 B2
(45) Date of Patent: Sep. 21, 2021

(54) METHOD FOR MANUFACTURING DISPLAY PANEL

(71) Applicant: SAMSUNG DISPLAY CO., LTD., Yongin-si (KR)

(72) Inventors: Haram Yoo, Yongin-si (KR); Sangyeol Kim, Hwaseong-si (KR); Sokwon Noh, Suwon-si (KR); Younghoon Jo, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 135 days.

(21) Appl. No.: 16/533,388

(22) Filed: Aug. 6, 2019

(65) Prior Publication Data

US 2020/0106057 A1 Apr. 2, 2020

(30) Foreign Application Priority Data

Sep. 28, 2018 (KR) ........................ 10-2018-0116029

(51) Int. Cl.
*H01L 51/56* (2006.01)
*G09G 3/3225* (2016.01)
*H01L 27/32* (2006.01)

(52) U.S. Cl.
CPC ........... *H01L 51/56* (2013.01); *G09G 3/3225* (2013.01); *H01L 27/326* (2013.01); *G09G 2300/0426* (2013.01)

(58) Field of Classification Search
CPC combination set(s) only.
See application file for complete search history.

(56) References Cited

U.S. PATENT DOCUMENTS

| 9,940,888 B2 | 4/2018 | Ryoo et al. |
| 10,134,826 B2 | 11/2018 | Ka et al. |
| 10,186,191 B2 | 1/2019 | Kang et al. |
| 2014/0239325 A1* | 8/2014 | Andrews ............ H01L 25/0753 257/98 |
| 2015/0036299 A1* | 2/2015 | Namkung ......... G02F 1/133345 361/749 |

(Continued)

FOREIGN PATENT DOCUMENTS

| EP | 3176772 A1 | 6/2017 |
| EP | 3226101 A1 | 10/2017 |

(Continued)

*Primary Examiner* — Ratisha Mehta
(74) *Attorney, Agent, or Firm* — Lewis Roca Rothgerber Christie LLP

(57) ABSTRACT

A method for manufacturing a display panel includes forming a circuit element layer including a transistor on a plurality of cell areas of a first working substrate. Each of the cell areas includes a hole area on which at least one first sub-opening groove on which the circuit element layer is not formed is located. The method further includes forming a display element layer including a light emitting element on the plurality of cell areas, removing at least one inorganic layer of the display element layer formed in the first sub-opening groove by stamping to define a second sub-opening groove, coupling the first working substrate to a second working substrate to define a working panel, and cutting the working panel into portions corresponding to the plurality of cell areas.

22 Claims, 23 Drawing Sheets

(56) References Cited

U.S. PATENT DOCUMENTS

| | | | |
|---|---|---|---|
| 2016/0035997 A1* | 2/2016 | Oh | H01L 51/5246 |
| | | | 257/40 |
| 2016/0087244 A1* | 3/2016 | Kim | H01L 51/5271 |
| | | | 257/40 |
| 2017/0287992 A1 | 10/2017 | Kwak et al. | |
| 2018/0006098 A1* | 1/2018 | Hong | H01L 27/3248 |
| 2018/0047802 A1* | 2/2018 | Yoon | H01L 27/3262 |
| 2019/0115547 A1* | 4/2019 | Lee | B32B 27/36 |

FOREIGN PATENT DOCUMENTS

| | | |
|---|---|---|
| KR | 10-1483193 B1 | 1/2015 |
| KR | 10-2017-0064598 A | 6/2017 |
| KR | 10-2017-0065059 A | 6/2017 |
| KR | 10-2017-0111827 A | 10/2017 |
| KR | 10-2017-0117291 A | 10/2017 |
| KR | 10-2017-0121375 A | 11/2017 |

* cited by examiner

METHOD FOR MANUFACTURING DISPLAY PANEL

CROSS-REFERENCE TO RELATED APPLICATION

This patent application claims priority to and the benefit of Korean Patent Application No. 10-2018-0116029, filed on Sep. 28, 2018 in the Korean Intellectual Property Office, the entire content of which is hereby incorporated by reference.

BACKGROUND

1. Field

Aspects of embodiments of the present disclosure herein relate to a method for manufacturing a display panel.

2. Description of the Related Art

In recent years, a mobile electronic device has been widely supplied, and a function thereof has been more and more diversified. A user prefers an electronic device having a wider display area and a narrower bezel area.

In order to decrease the bezel area, various types of electronic devices have been developed. For example, an electronic device without the bezel area may be provided. In this case, the electronic device may include a camera and a sensor, which overlap the display area.

The electronic device may include a hole in which the camera and the sensor, which overlap the display area, are disposed. The hole may be formed by removing a portion of an organic material or an inorganic material contained in the electronic device by using a laser or the like. However, while the organic material or the inorganic material is removed by using the laser, particles may be generated, and, thus, a follow-up process may be delayed.

SUMMARY

According to an aspect of embodiments of the present disclosure, a method for manufacturing a display panel in which a bezel area is reduced is provided. According to another aspect of embodiments of the present disclosure, a manufacturing method is capable of reducing a failure rate in a process of manufacturing a display panel having a wide display area and a narrow bezel area.

According to one or more embodiments of the inventive concept, a method for manufacturing a display panel includes: forming a circuit element layer including a transistor on a plurality of cell areas of a first working substrate, wherein each of the cell areas includes a hole area on which at least one first sub-opening groove on which the circuit element layer is not formed is located; forming a display element layer including a light emitting element on the plurality of cell areas; removing at least one inorganic layer of the display element layer formed in the first sub-opening groove by stamping to define a second sub-opening groove; coupling a first working substrate to a second working substrate to define a working panel; and cutting the working panel into portions corresponding to the plurality of cell areas.

In an embodiment, the at least one inorganic layer may include an electrode arranged on an organic light emitting layer of the light emitting element.

In an embodiment, the light emitting element may include an organic light emitting diode, and the electrode may be a cathode electrode of the organic light emitting diode.

In an embodiment, the method may further include forming a protection layer on the display element layer before the removing of the at least one inorganic layer.

In an embodiment, the removing of the at least one inorganic layer may include removing the at least one inorganic layer and the protection layer concurrently by the stamping.

In an embodiment, the removing of at least one inorganic layer may include: providing stamping equipment in which at least one stamp is arranged in correspondence to each of the plurality of cell areas; arranging the first working substrate such that a top surface of the at least one stamp faces a top surface of the display element layer; attaching and then detaching the top surface of the at least one stamp to or from the top surface of the display element layer by using the stamping equipment to delaminate at least one inorganic layer of the display element layer in correspondence to the first sub-opening groove to define the second sub-opening groove; and transferring the delaminated inorganic layer attached to the top surface of the at least one stamp to a transfer film.

In an embodiment, the at least one stamp may be made of a rubber material having an adhesion property.

In an embodiment, the at least one stamp may be made of polydimethylsiloxane or silicon.

In an embodiment, the at least one stamp may have an adhesion force of about 300 gf/inch or more.

In an embodiment, the transfer film may have an adhesion force greater than that of the at least one stamp.

In an embodiment, a number of stamps of the at least one stamp of the stamping equipment may be equal to or less than that of the plurality of cell areas of the first working substrate.

In an embodiment, the method may further include irradiating the hole area with a laser to remove a layer exposed by the second sub-opening groove to define a third sub-opening groove after the removing of the at least one inorganic layer.

In an embodiment, the exposed layer may include an organic layer of the display element layer.

In an embodiment, each of the plurality of cell areas may include a display area on which a plurality of pixels is located and a bezel area around the display area, and the hole area may be located in the display area.

In an embodiment, the method may further include forming a filling layer in the hole area of the first working substrate before the coupling of the first working substrate to the second working substrate.

In an embodiment, the filling layer may have a same refractive index as one of the first working substrate and the second working substrate.

In an embodiment, the method may further include: forming a functional layer on the display panel; forming an adhesion layer on the functional layer; and forming a window on the adhesion layer.

In an embodiment, the method may further include forming an upper opening groove by removing the functional layer and the adhesion layer in correspondence to the hole area before the forming of the window.

In an embodiment, the method may further include forming a second filling layer in the upper opening groove before the forming of the window.

In an embodiment, the second filling layer may have a same refractive index as one of the window and the second working substrate.

In an embodiment, the method may further include forming a sealing member configured to seal each of the plurality of cell areas before the coupling of the first working substrate to the second working substrate.

In an embodiment, each of the plurality of cell areas may include a display area on which a plurality of pixels is located and a bezel area around the display area, and the sealing member may be located in the bezel area.

In an embodiment, the hole area may be located in the display area, and the forming of the sealing member may further include forming a hole sealing member at a boundary of the hole area.

BRIEF DESCRIPTION OF THE DRAWINGS

The accompanying drawings are included to provide a further understanding of the inventive concept, and are incorporated in and constitute a part of this specification. The drawings illustrate some exemplary embodiments of the inventive concept and, together with the description, serve to explain principles of the inventive concept. In the drawings.

DETAILED DESCRIPTION

Figure 1:
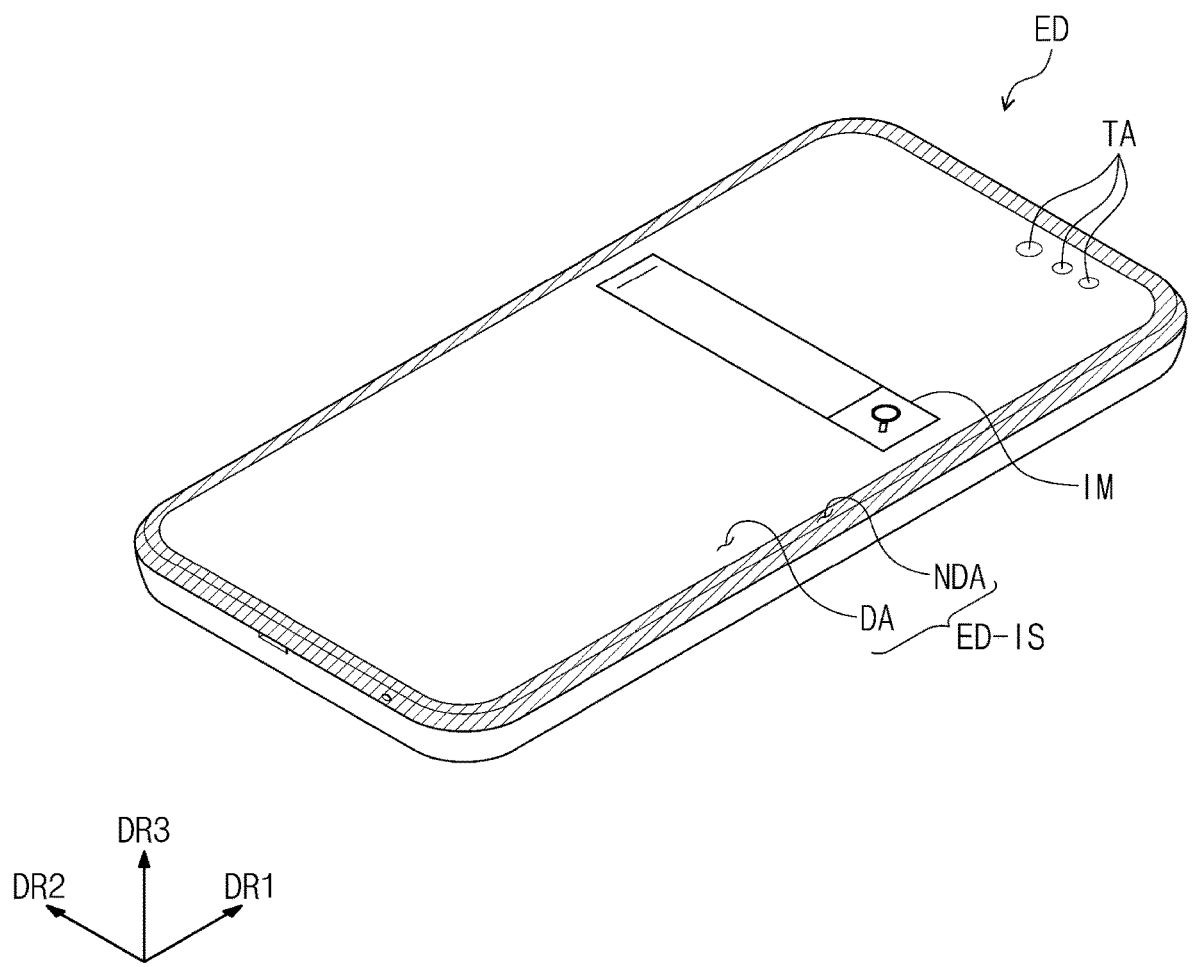
FIG. 1 is a perspective view illustrating an electronic device according to an exemplary embodiment of the inventive concept.

Herein, some embodiments of the inventive concept will be described with reference to the accompanying drawings. Like reference numerals refer to like elements throughout. In the drawings, the thicknesses, ratios, and dimensions of components may be exaggerated for clarity of illustration. As used herein, the term "and/or" includes any and all combinations of one or more of the associated listed items.

It is to be understood that although the terms "first" and "second" are used herein to describe various elements, these elements should not be limited by these terms. The terms are used to distinguish one component from other components. For example, a first element referred to as a "first" element in one embodiment may be referred to as a "second" element in another embodiment. The terms of a singular form may include plural forms unless referred to the contrary.

Also, spatially relative terms, such as "below," "lower," "above," and "upper," may be used herein for ease of description to describe an element and/or a feature's relationship to another element(s) and/or feature(s) as illustrated in the drawings. However, the terms are relative concepts and described with respect to the direction indicated in the drawings. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The meaning of "include" or "comprise" specifies a property, a region, a fixed number, a step, a process, an element, and/or a component, but does not exclude other properties, regions, fixed numbers, steps, processes, elements, and/or components.

Where an element is described as being related to another element, such as being "on" another element or "located on" a different element or a layer, this includes both a case in which an element is located directly on another element or a layer and a case in which an element is located on another element via another layer or still another element. In contrast, where an element is described as being related to another element, such as being "directly on" another element or "located directly on" a different element or a layer, this indicates a case in which an element is located on another element or a layer with no intervening element or layer therebetween.

The terminology used herein is for the purpose of describing particular embodiments and is not intended to be limiting of example embodiments. As used herein, the singular forms "a," "an," and "the" are intended to include the plural forms as well, unless the context clearly indicates otherwise.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
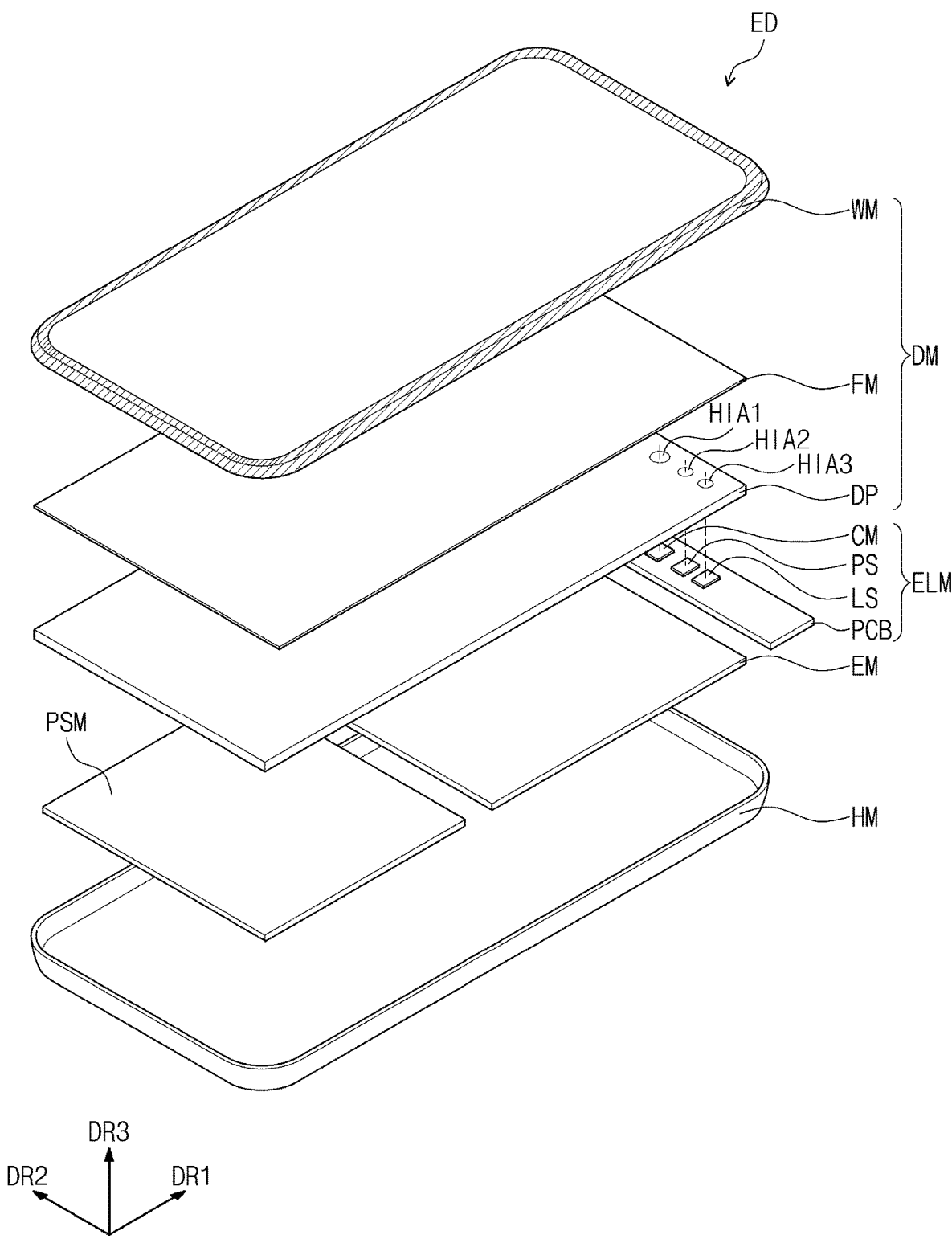
FIG. 2 is an exploded perspective view illustrating the electronic device according to an exemplary embodiment of the inventive concept.
Figure 3:
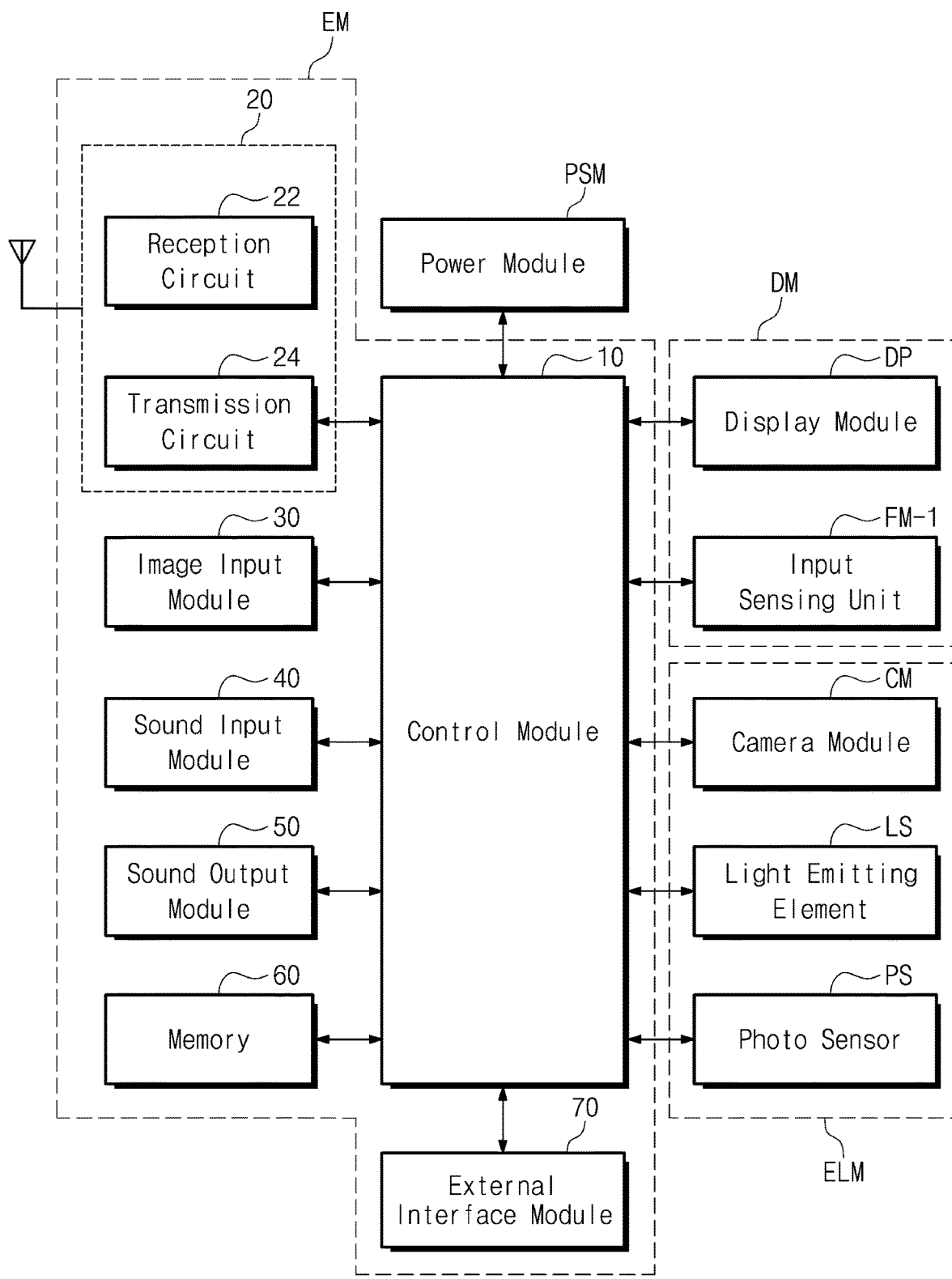
FIG. 3 is a block diagram illustrating the electronic device according to an exemplary embodiment of the inventive concept.

FIG. 1 is a perspective view illustrating an electronic device ED according to an exemplary embodiment of the inventive concept; FIG. 2 is an exploded perspective view illustrating the electronic device ED according to an exemplary embodiment of the inventive concept; and FIG. 3 is a block diagram illustrating the electronic device ED according to an exemplary embodiment of the inventive concept.

As illustrated in FIG. 1, the electronic device ED may display an image IM through a display surface ED-IS. The display surface ED-IS is parallel to a surface defined by a first directional axis DR1 and a second directional axis DR2. A normal direction of the display surface ED-IS, i.e., a thickness direction of the electronic device ED, indicates a third directional axis DR3.

Herein, a front surface (or top surface) and a rear surface (or bottom surface) of each of members or units are distinguished by the third directional axis DR3. However, the first to third directional axes DR1, DR2, and DR3 in the exemplary embodiments are only exemplarily illustrated. Herein, first to third directions may be directions indicated by the first to third directional axes DR1, DR2, and DR3 and designated by the same reference numerals, respectively.

The display surface ED-IS includes a display area DA and a non-display area NDA disposed adjacent to the display area DA. The non-display area NDA may be an area on which an image is not displayed. The non-display area NDA includes a bezel area that blocks an optical signal. The display area DA may include at least one transmission area TA. Here, although three transmission areas TA are exemplarily illustrated as an embodiment of the inventive concept, embodiments of the inventive concept are not limited to a particular number of the transmission areas. The transmission area TA may be disposed in the display area DA and may transmit light therethrough. Here, light may be external natural light or, e.g., infrared rays generated from a light emitting element LS (refer to FIG. 2).

Although the non-display area NDA surrounding the display area DA is exemplarily illustrated in the embodiment, embodiments of the inventive concept are not limited thereto. For example, the non-display area NDA may be disposed at one side of the display area DA. Although the flat display surface ED-IS is exemplarily illustrated in the embodiment, embodiments of the inventive concept are not limited thereto. For example, a curved area may be disposed at each of both sides of the display surface ED-IS, which face each other in the second direction DR2, along an edge extending in the first direction DR1.

Although a mobile phone is exemplarily illustrated in an embodiment, embodiments of the inventive concept are not limited thereto. For example, the electronic device may be embodied by any of various information supply devices, such as a television, a navigation unit, a computer monitor, a notebook computer, and a game console.

As illustrated in FIGS. 2 and 3, in an embodiment, the electronic device ED may include a display module DM, an electronic module EM, an electronic optical module ELM, a power module PSM, and a housing HM.

The display module DM generates an image. In an embodiment, the display module DM includes a display panel DP, a functional unit FM, and a window WM.

However, embodiments of the inventive concept are not limited to the display panel DP. For example, the display panel DP may include an organic light emitting display panel or a light emitting display panel such as a quantum dot light emitting display panel.

The display module DM may detect an external pressure by including the functional unit FM. The functional unit FM may include any of various units for enhancing a function of the display module DM.

In an embodiment, the functional unit FM may include a reflection preventing unit and an input sensing unit FM-1. The reflection preventing unit may include a polarizer and/or a retarder. Each of the polarizer and the retarder may be an elongation-type or a coating-type. The input sensing unit FM-1 may include a capacitive touch panel, a pressure sensitive touch panel, or an electromagnetic induction touch panel.

The window WM provides an outer shape of the electronic device ED. The window WM may include a base substrate and further include functional layers, such as a reflection preventing layer and an anti-fingerprint layer. Although not separately shown, the display module DM may include at least one adhesion layer. The adhesion layer may include an optically transparent adhesion layer or a pressure sensitive adhesion layer.

In an embodiment, the electronic module EM may include a control module 10, a wireless communication module 20, an image input module 30, a sound input module 40, a sound output module 50, an external interface module 70, and the like. The above-described modules may be mounted on a circuit board or electrically connected to each other through a flexible circuit board. The electronic module EM may be electrically connected to the power module PSM.

The control module 10 controls an overall operation of the electronic device ED. For example, the control module 10 activates or deactivates the display module DM in accordance with a user's input. The control module 10 may control the image input module 30, the sound input module 40, the sound output module 50, and the like in accordance with the user's input. The control module 10 may include at least one microprocessor.

In an embodiment, the wireless communication module 20 may transceive a wireless signal with another terminal by using a Bluetooth or WiFi link. The wireless communication module 20 may use a general communication line to transceive a voice signal. In an embodiment, the wireless communication module 20 includes a reception circuit 22 that demodulates the received signal and a transmission circuit 24 that modulates a signal to be transmitted and transmits the modulated signal.

The image input module 30 processes an image signal to convert the image signal into image data that is displayable on the display module DM. The sound input module 40 receives an external sound signal through a microphone in a recording mode or a voice recognition mode to convert the received sound signal into electrical voice data. The sound output module 50 converts sound data received from the wireless communication module 20 or sound data stored in a memory 60 to output the converted sound data to the outside.

The external interface module 70 serves as an interface connected to an external charger, a wire/wireless data port, a card socket (e.g., a memory card socket and a SIM/UIM card socket), or the like.

In an embodiment, the electronic optical module ELM may include a camera module CM. The camera module CM photographs an external image. The electronic optical module ELM may further include a light emitting element LS and a photo sensor PS. The light emitting element LS may emit infrared rays, and the photo sensor PS may receive infrared rays reflected by an external object. The light emitting element LS and the photo sensor PS may serve as a proximity sensor. The camera module CM, the light emitting element LS, and the photo sensor PS may be mounted to a circuit board PCB or electrically connected to each other through a flexible circuit board.

The power module PSM provides power for an overall operation of the electronic device ED. In an embodiment, the power module PSM may include a conventional battery device.

The housing HM is coupled to the display module DM, such as to the window WM, to accommodate the above-described modules. In FIG. 2, the housing HM including one member is exemplarily illustrated. However, the housing HM may include two or more components that are assembled with each other.

Figure 4A:
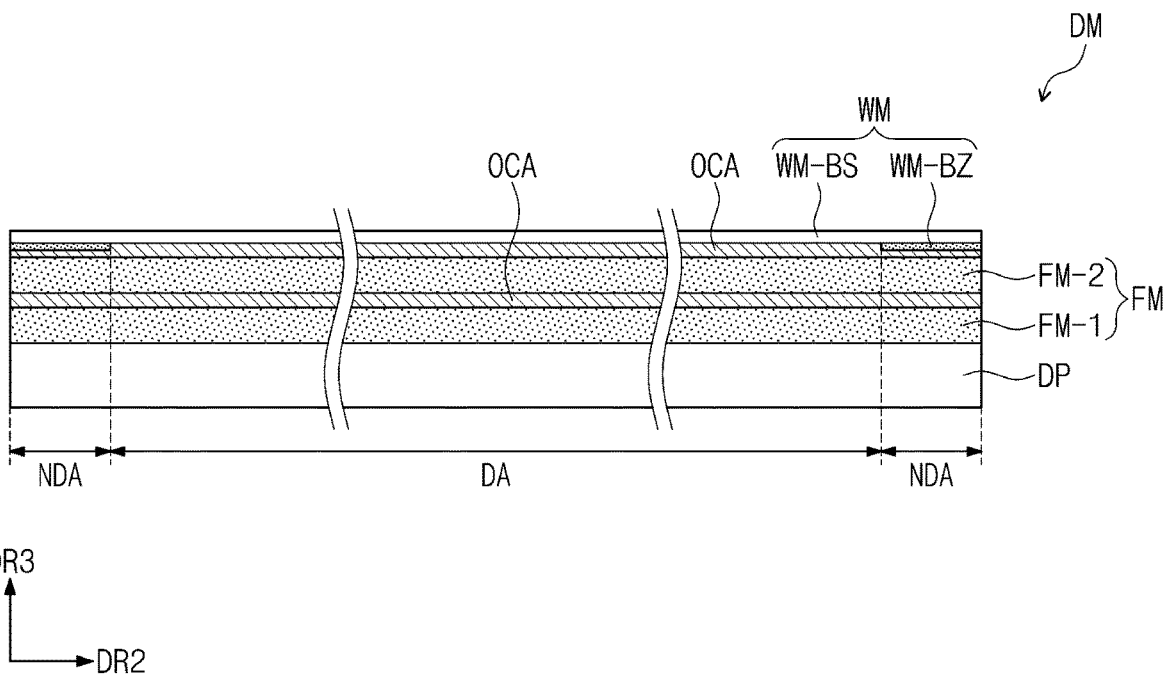
FIGS. 4A and 4B are cross-sectional views illustrating a display module according to exemplary embodiments of the inventive concept.
Figure 4B:
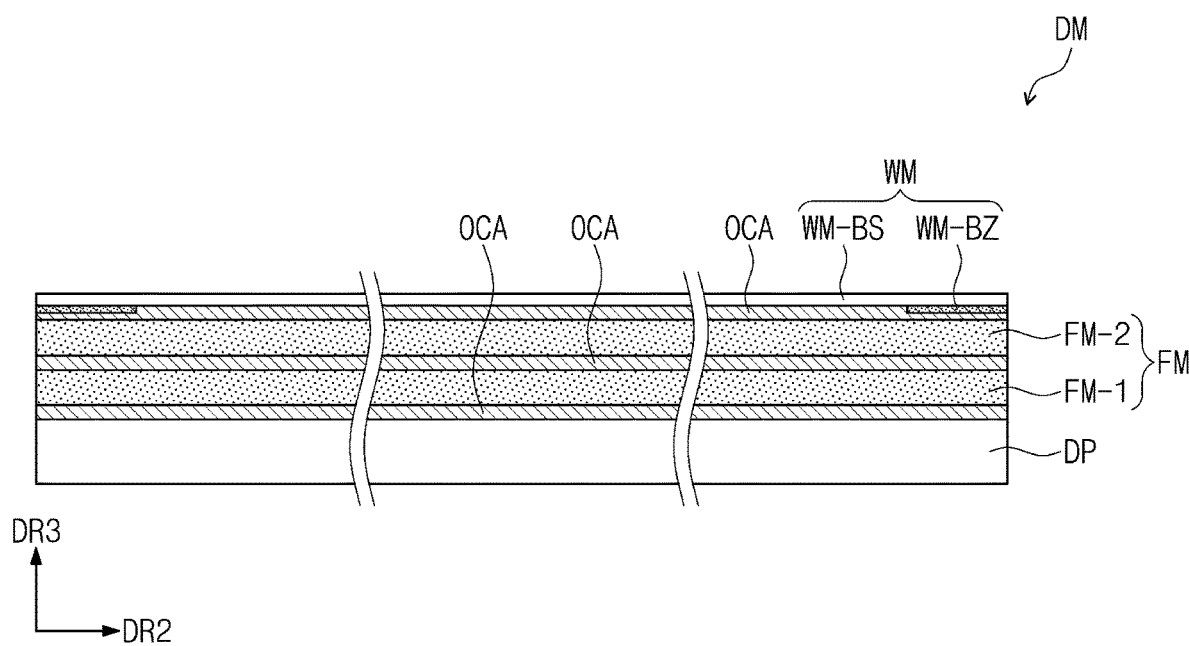

FIGS. 4A and 4B are cross-sectional views illustrating a display module DM according to exemplary embodiments of the inventive concept. Herein, further detailed description regarding the same components described with reference to FIGS. 1 to 3 will be omitted.

As illustrated in FIG. 4A, in an embodiment, the display module DM includes a display panel DP, an input sensing unit FM-1, a reflection preventing unit FM-2, and a window WM. The input sensing unit FM-1, which is a "layer type," may be directly disposed on a base surface provided by the display panel DP. In this specification, a wording of "B component is directly disposed on A component" represents that an additional adhesion layer/adhesion member is not disposed between the A component and the B component. For example, the B component may be formed on a base surface provided by the A component through a continuous process after the A component is formed.

The reflection preventing unit FM-2 may include at least a polarizing film. The polarizing film may be an elongation-type polarizer. The reflection preventing unit FM-2 may include a λ/4 retarder film. The reflection preventing unit FM-2 may further include a λ/2 retarder film. Each of the λ/4 retarder film and the λ/2 retarder film may be an elongation-type retarder. In an embodiment, the polarizer and the retarder may be coupled to each other through an adhesion layer.

In an embodiment, the input sensing unit FM-1, the reflection preventing unit FM-2, and the window WM may be coupled to each other through adhesion layers OCA.

As illustrated in FIG. 4B, in an embodiment, the input sensing unit FM-1, which is a "panel type," may be connected to the display panel DP through an adhesion member. The "panel type" may include a base layer providing a base surface, e.g., a synthetic resin film, a composite material film, or a glass substrate. However, the "layer type" may not include the base layer. That is, the above-described units expressed as a "layer" are disposed on a base surface provided by another unit.

The window WM may include a base substrate WM-BS and a bezel pattern WM-BZ. The base substrate WM-BS includes a transparent substrate, such as a glass substrate. However, embodiments of the inventive concept are not limited thereto. For example, the base substrate WM-BS may include a reinforced plastic. The bezel pattern WM-BZ may include a colored organic layer and substantially define the peripheral area NDA in FIG. 1. In an embodiment, the bezel pattern WM-BZ may have a multilayer structure. The multilayer structure may include a colored layer and a black light shielding layer.

In another exemplary embodiment, the input sensing unit FM-1 and the reflection preventing unit FM-2 of the display module DM may be omitted. The window WM may be directly disposed on the display panel DP through a continuous process.

Figure 5:
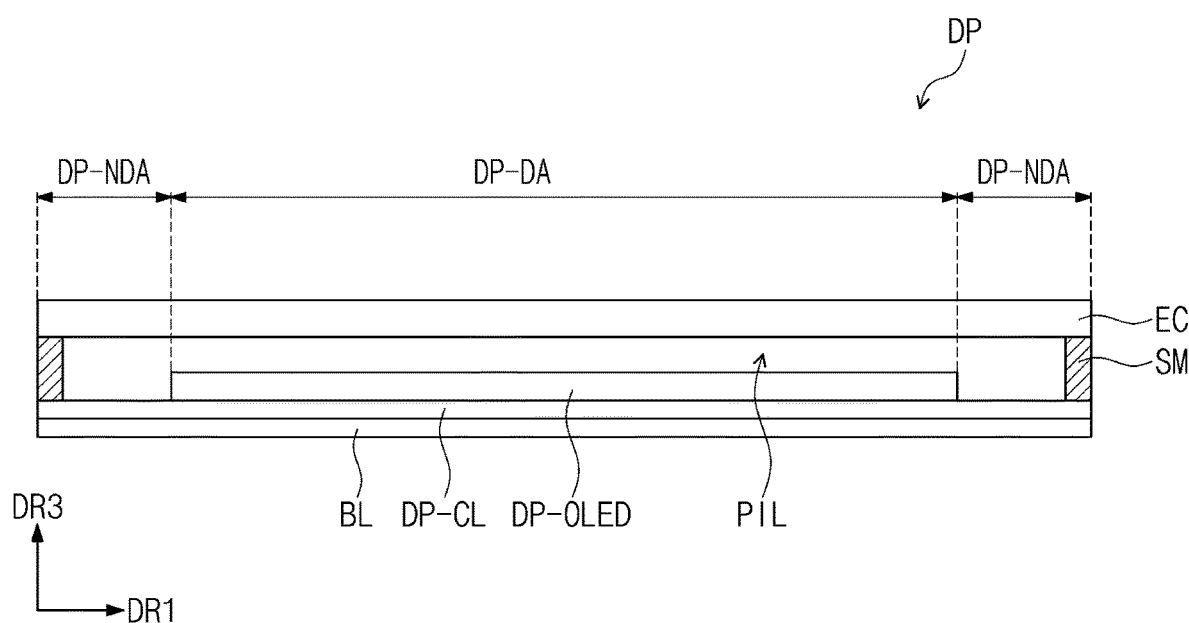
FIG. 5 is a cross-sectional view illustrating a display panel according to an exemplary embodiment of the inventive concept.
Figure 6:
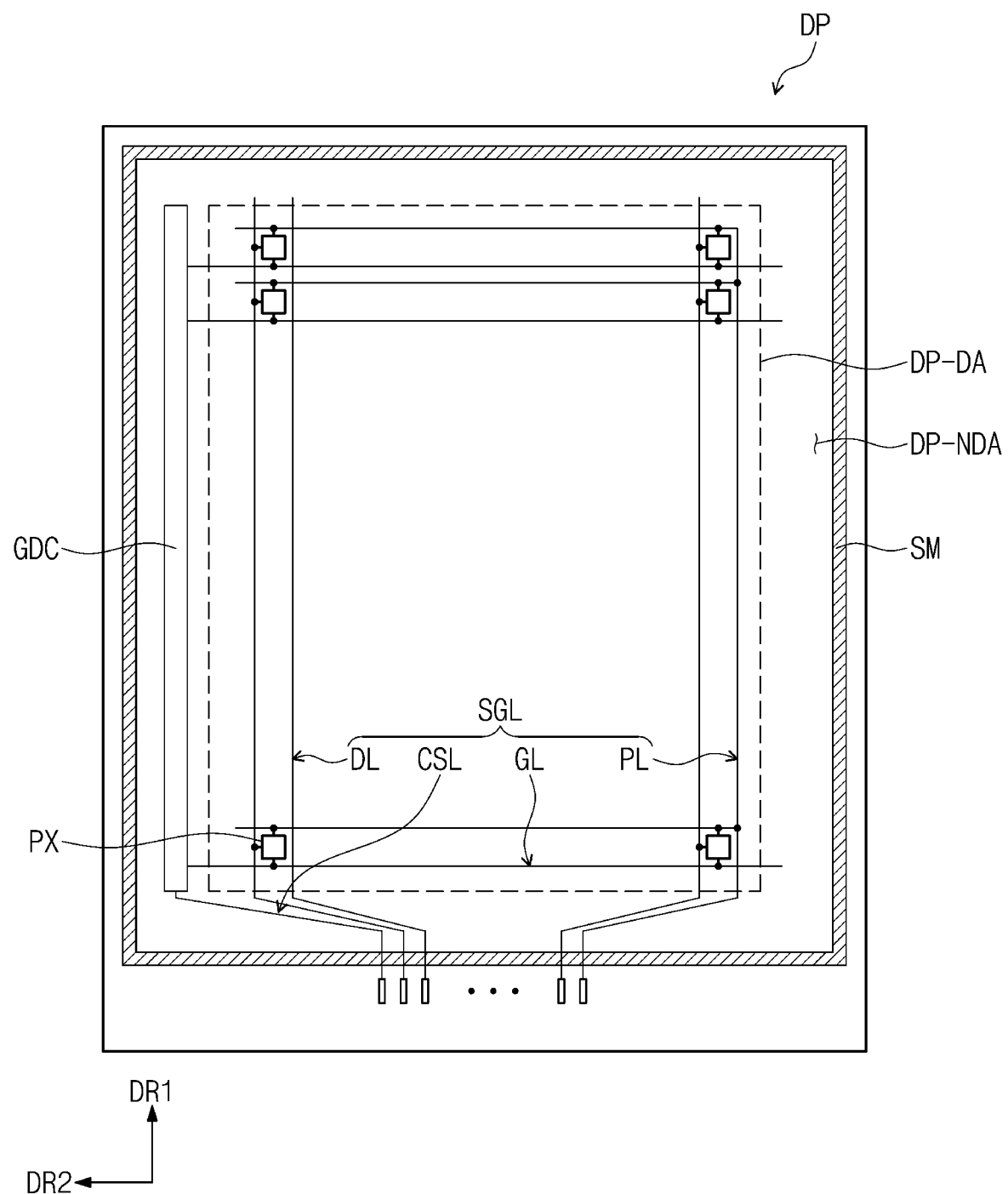
FIG. 6 is a plan view illustrating the display panel according to an exemplary embodiment of the inventive concept.

FIG. 5 is a cross-sectional view illustrating a display panel DP according to an exemplary embodiment of the inventive concept; FIG. 6 is a plan view illustrating the display panel DP according to an exemplary embodiment of the inventive concept; and FIG. 7 is an enlarged cross-sectional view illustrating the display panel DP according to an exemplary embodiment of the inventive concept.

Figure 7:
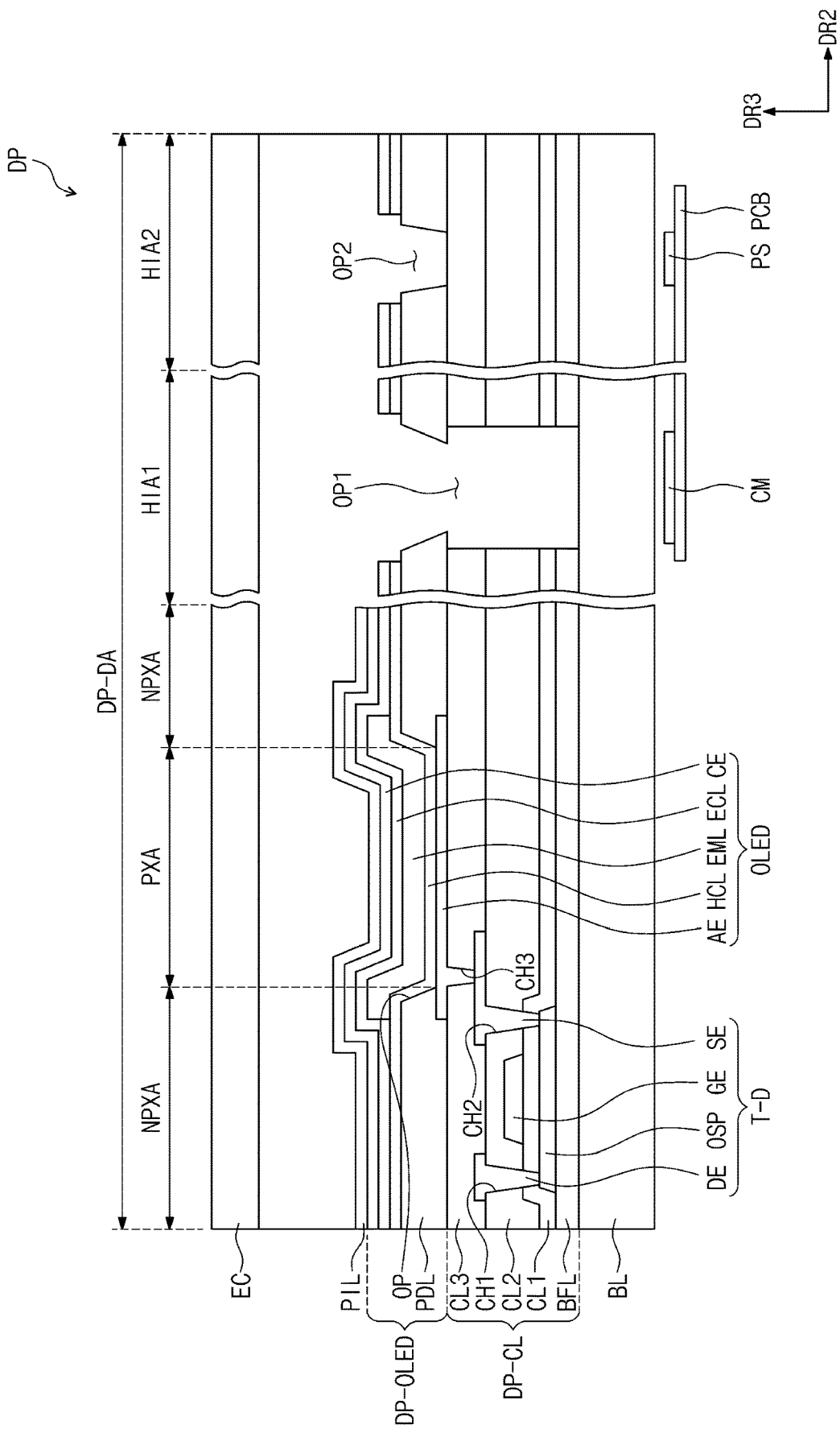
FIG. 7 is an enlarged cross-sectional view illustrating the display panel according to an exemplary embodiment of the inventive concept.

As illustrated in FIGS. 5 to 7, in an embodiment, the display panel DP includes a base layer BL, a circuit element layer DP-CL disposed on the base layer BL, a display element layer DP-OLED disposed on the circuit element layer DP-CL, an encapsulation substrate EC, and a sealing member SM.

In an embodiment, the base layer BL may include a glass substrate. In an embodiment, the base layer BL may include a substrate having a substantially constant refractive index in a visible ray range.

The circuit element layer DP-CL includes at least one insulation layer and a circuit element. Herein, the insulation layer provided in the circuit element layer DP-CL is referred to as an intermediate insulation layer. In an embodiment, the intermediate insulation layer includes at least one intermediate inorganic layer and/or at least one intermediate organic layer. The circuit element includes a signal line and a driving circuit of a pixel.

The display element layer DP-OLED includes a light emitting element. The display element layer DP-OLED may include organic light emitting diodes as the light emitting element. The display element layer DP-OLED includes a pixel defining layer, e.g., an organic material.

A protection layer may be further disposed on the display element layer DP-OLED. The protection layer may protect a second electrode CE of each of organic light emitting diodes. In an embodiment, the protection layer may contain an inorganic material, such as a silicon oxide, silicon nitride, or a silicon oxynitride.

The encapsulation substrate EC may be a transparent substrate. In an embodiment, the encapsulation substrate EC may include a glass substrate. In an embodiment, the encapsulation substrate EC may include a substrate having a substantially constant refractive index in a visible ray range.

A lamination structure of the base layer BL, the circuit element layer DP-CL, and the display element layer DP-OLED may be defined as a lower display substrate. The sealing member SM may couple the lower display substrate and the encapsulation substrate EC to each other. The sealing member SM may extend along an edge of the encapsulation substrate EC.

The sealing member SM overlaps a non-display area DP-NDA of the display panel DP. The non-display area DP-NDA of the display panel DP is an area on which a pixel PX is not provided. The non-display area DP-NDA of the display panel DP may overlap the non-display area NDA of the electronic device ED shown in FIG. 1.

The encapsulation substrate EC and the sealing member SM may prevent or substantially prevent moisture from being permeated into the lower display substrate. According to an embodiment of the inventive concept, the sealing member SM may directly couple a top surface of the base layer BL and a bottom surface of the encapsulation substrate EC.

The sealing member SM may include an inorganic adhesion member, such as frit. However, embodiments of the inventive concept are not limited thereto. For example, the sealing member SM may include an organic adhesion member. In an embodiment, since the display panel DP may be completely sealed from the outside, the display panel DP may have an improved strength and prevent or substantially prevent a defect of the light emitting element.

As illustrated in FIG. 6, the display panel DP may include a driving circuit GDC, a plurality of signal lines SGL, and a plurality of pixels PX. The pixels PX are disposed on a display area DP-DA. Each of the pixels PX includes a light emitting element and a pixel driving circuit connected to the light emitting element. The driving circuit GDC, the signal lines SGL, and the pixel driving circuit may be contained in the circuit element layer DP-CL shown in FIG. 5.

The driving circuit GDC may include a scan driving circuit. The scan driving circuit generates a plurality of scan signals and sequentially outputs the scan signals to a plurality of scan lines GL, which will be described later. The scan driving circuit may further output another control signal to the driving circuit of each of the pixels PX.

In an embodiment, the scan driving circuit may include a plurality of thin-film transistors that are formed through a same process as the driving circuit of each of the pixels PX, e.g., a low temperature polycrystalline silicon (LTPS) process or a low temperature polycrystalline oxide (LTPO) process.

The signal lines SGL include scan lines GL, data lines DL, a power line PL, and a control signal line CSL. Each of the scan lines GL is connected to a corresponding pixel of the pixels PX, and each of the data lines DL is connected to a corresponding pixel of the pixels PX. The power line PL is connected to the pixels PX. The control signal line CSL may provide control signals to the scan driving circuit.

The signal lines SGL may be connected to a circuit board (not shown). In an embodiment, the signal lines SGL may be connected to an integrated chip type timing control circuit that is mounted to the circuit board. In an embodiment of the inventive concept, the integrated chip may be disposed on the non-display area DP-NDA and connected to the signal lines SGL.

As illustrated in FIG. 7, the circuit element layer DP-CL may include a buffer layer BFL that is an inorganic layer, a first intermediate inorganic layer CL1, a second intermediate inorganic layer CL2, and an intermediate organic layer CL3. In FIG. 7, an arrangement relationship between a semiconductor pattern OSP, a control electrode GE, an input electrode DE, and an output electrode SE of a driving transistor T-D is exemplarily illustrated. First and second contact holes CH1 and CH2 are also exemplarily illustrated.

The display element layer DP-OLED includes a light emitting element. The display element layer DP-OLED may include organic light emitting diodes OLED as the light emitting element. The display element layer DP-OLED includes a pixel defining layer PDL. For example, the pixel defining layer PDL may be an organic layer.

A first electrode AE is disposed on the intermediate organic layer CL3. The first electrode AE is connected to the output electrode SE through a third contact hole CH3 passing through the intermediate organic layer CL3. An opening OP is defined in the pixel defining layer PDL. The opening OP of the pixel defining layer PDL exposes at least a portion of the first electrode AE. The opening OP of the pixel defining layer PDL is referred to as a light emitting opening to be distinguished from other openings.

The display area DP-DA of the display panel DP may include a light emitting area PXA and a non-light emitting area NPXA disposed adjacent to the light emitting area PXA. In an embodiment, the non-light emitting area NPXA may surround the light emitting area PXA. In an embodiment, the light emitting area PXA is defined in correspondence to a partial area of the first electrode AE, which is exposed by the light emitting opening OP.

A hole control layer HCL may be disposed in common on the light emitting area PXA and the non-light emitting area NPXA. The hole control layer HCL may include a hole transporting layer and a hole injection layer. A light emitting layer EML is disposed on the hole control layer HCL. The light emitting layer EML may be disposed on an area corresponding to the light emitting opening OP. That is, the light emitting layer EML may be separately provided on each of the pixels PX. The light emitting layer EML may contain an organic material and/or an inorganic material. The light emitting layer EML may generate colored light having a color (e.g., a predetermined color).

An electron control layer ECL is disposed on the light emitting layer EML. The electron control layer ECL may include an electron transporting layer and an electron injection layer. The hole control layer HCL and the electron control layer ECL may be provided in common to the plurality of pixels by using an open mask. A second electrode CE is disposed on the electron control layer ECL. The second electrode CE is disposed in common to the plurality of pixels.

The display area DP-DA of the display panel DP may include at least one hole area. The hole area may correspond to the transmission area TA in FIG. 1. Accordingly, a number of hole areas may correspond to the number of the transmission areas TA. In FIG. 7, a first hole area HIA1 and a second hole area HIA2 of the hole area are illustrated as an example. In an embodiment, the first hole area HIA1 may be defined as an area on which a camera module CM is disposed, and the second hole area HIA2 may be defined as an area on which at least one of a light emitting element LS and a photo sensor PS is disposed.

In the first hole area HIA1, the base layer BL is disposed, and the circuit element layer DP-CL and the display element layer DP-OLED are removed. As the circuit element layer DP-CL and the display element layer DP-OLED are removed, a space defined on the base layer BL corresponding to the first hole area HIA1 may be defined as a first opening groove OP1. The first opening groove OP1 may be defined by inner walls of the circuit element layer DP-CL and the display element layer DP-OLED, which are formed by removing the circuit element layer DP-CL and the display element layer DP-OLED.

Although not shown in the drawings, in an embodiment, a groove sealing member may be further provided along the inner walls of the circuit element layer DP-CL and the display element layer DP-OLED. As the inner walls of the circuit element layer DP-CL and the display element layer DP-OLED, which are exposed through the first opening groove OP1, are sealed, the groove sealing member may prevent or substantially prevent external pollutants from being introduced into the circuit element layer DP-CL and the display element layer DP-OLED.

In the second hole area HIA2, the base layer BL and the circuit element layer DP-CL are disposed, and the display element layer DP-OLED is removed. As the display element layer DP-OLED is removed, a space defined on the circuit element layer DP-CL corresponding to the second hole area HIA2 may be defined as a second opening groove OP2. The second opening groove OP2 may be defined by an inner wall of the display element layer DP-OLED, which is defined by removing the display element layer DP-OLED.

Although a structure in which the circuit element layer DP-CL remains in the second hole area is shown in FIG. 7, the circuit element layer DP-CL disposed in the second hole area HIA2 may be removed like the first hole area HIA1 or only a portion of the circuit element layer DP-CL may be removed.

FIGS. 8A to 8D are plan views illustrating a process for manufacturing a display panel according to an embodiment of the inventive concept; FIGS. 9A to 9E are cross-sectional views illustrating a stamping process shown in FIG. 8B; and FIGS. 10A and 10B are cross-sectional views illustrating a laser process shown in FIG. 8C.

Figure 8A:
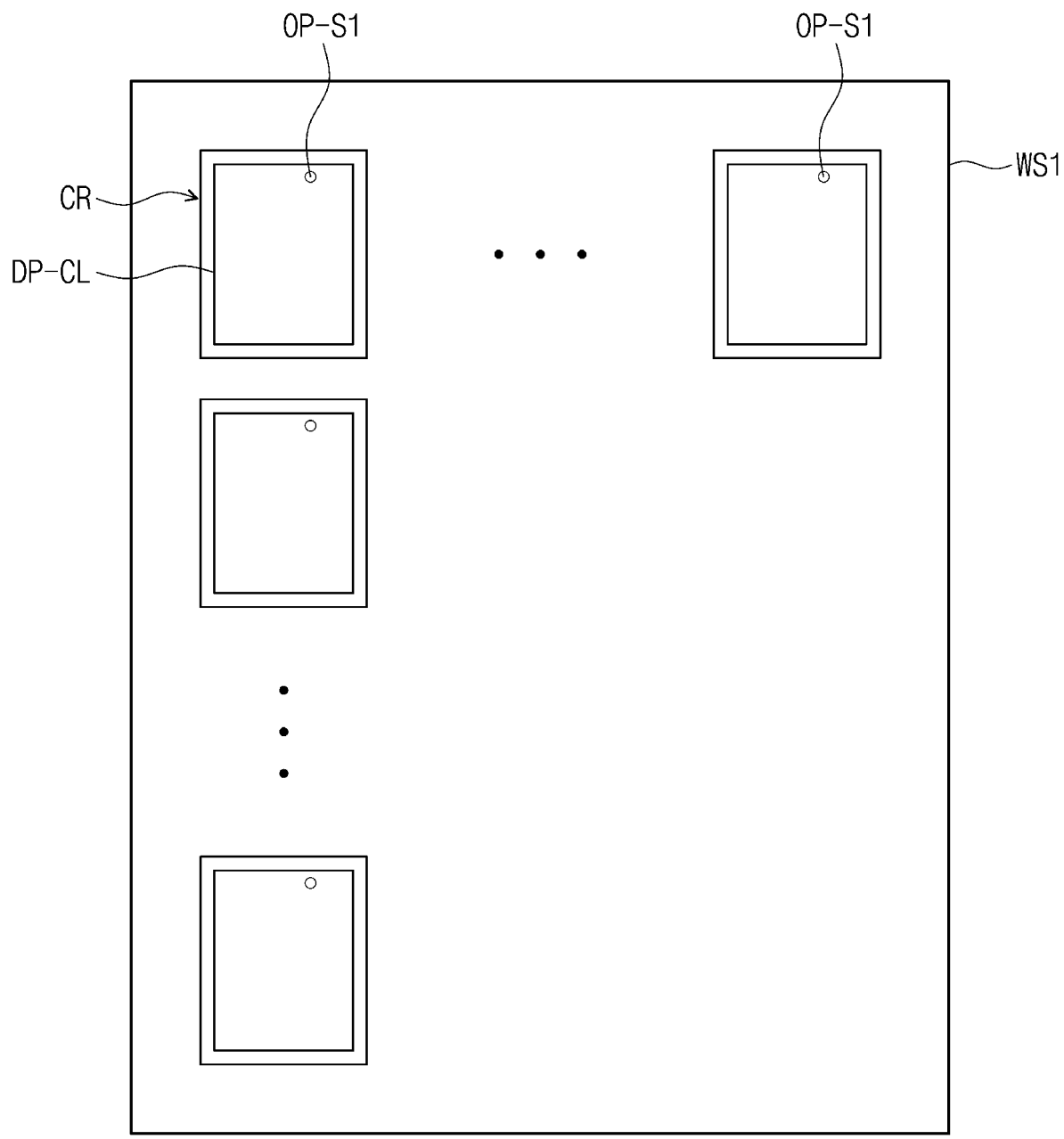
FIGS. 8A to 8D are plan views illustrating a process for manufacturing the display panel according to an exemplary embodiment of the inventive concept.

Referring to FIG. 8A, a first working substrate WS1 includes a plurality of cell areas CR. Each of the cell areas CR corresponds to the display panel DP (refer to FIG. 1). A circuit element layer DP-CL is formed on each of the cell areas CR of the first working substrate WS1 in FIG. 8A. The circuit element layer DP-CL may be formed through a process of forming an insulation layer, a semiconductor layer, and a conductive layer by coating, deposition, or the like and a process of patterning the insulation layer, the semiconductor layer, and the conductive layer by a photolithography process and an etching process.

As illustrated in FIG. 8A, in an embodiment, a first sub-opening groove OP-S1 may be defined in each of the cell areas CR. The first sub-opening groove OP-S1 may be formed by removing the circuit element layer DP-CL and correspond to the first hole area HIA1 in FIG. 7. The circuit element layer DP-CL may be removed through the patterning process to from the first sub-opening groove OP-S1. Embodiments of the inventive concept are not limited to the method of forming the first sub-opening groove OP-S1 in the circuit element layer DP-CL.

Figure 8B:
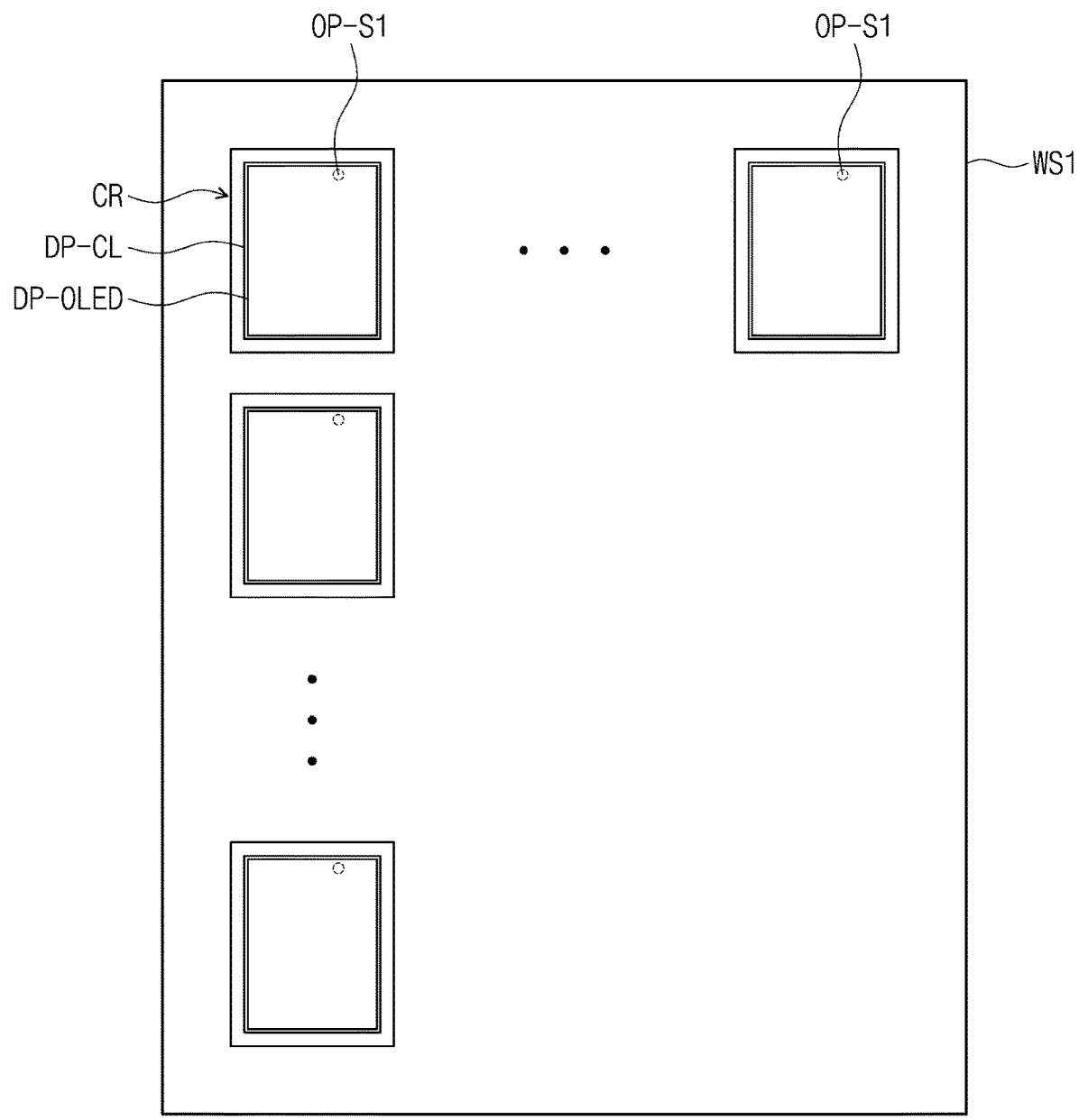

A display element layer DP-OLED is formed on each of the cell areas CR of the first working substrate WS1 in FIG. 8B. Components of the display element layer DP-OLED may be formed by a deposition process. In an embodiment, layers formed over the display area DP-DA, such as the second electrode CE of the display element layer DP-OLED, which is deposited by using an open mask, remain in the first sub-opening groove OP-S1.

The first working substrate WS1 may further include a protection layer PIL (refer to FIG. 7) formed on the display element layer OP-OLED.

Figure 8C:
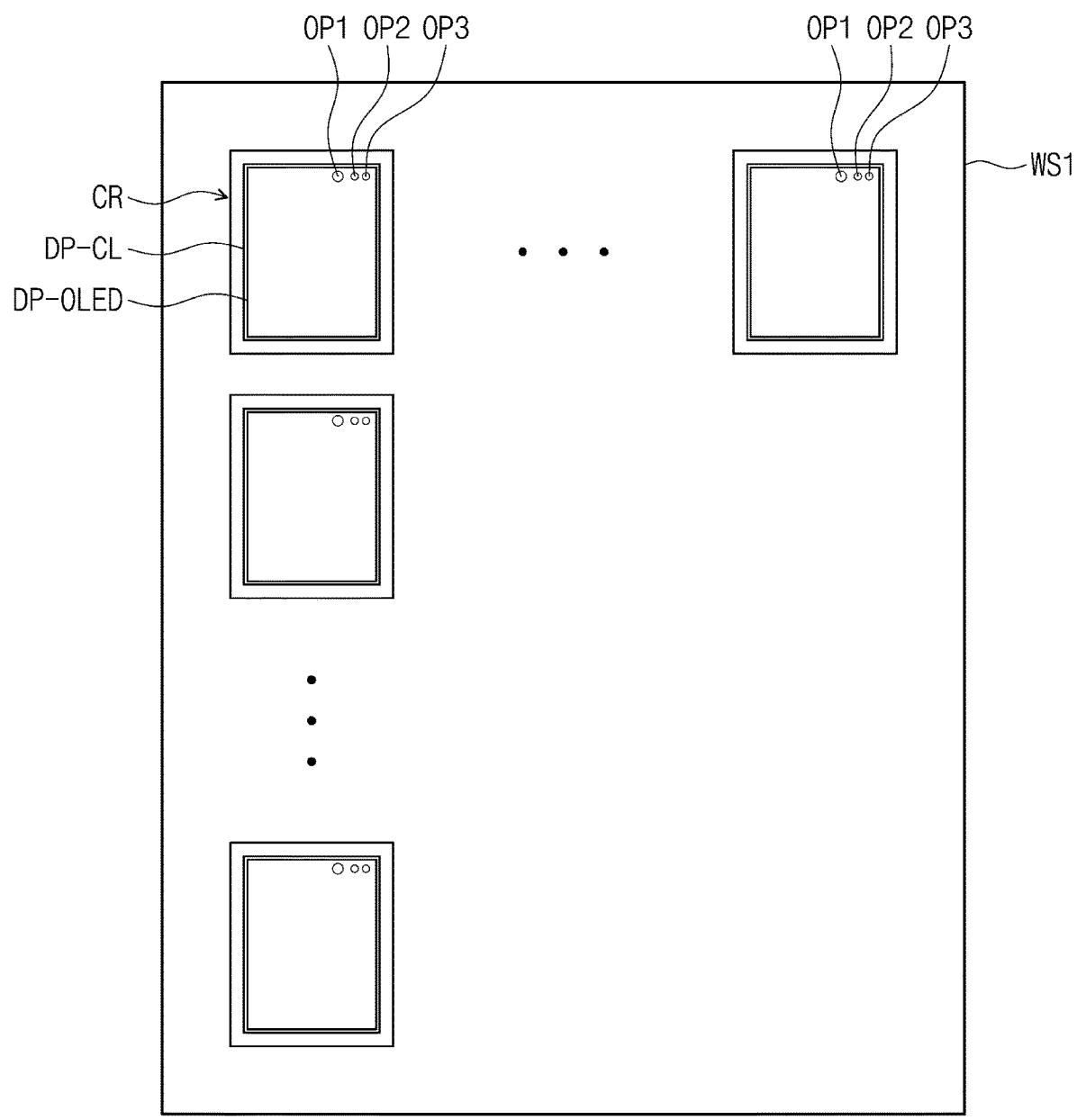

Referring to FIG. 8C, in an embodiment, a first opening groove OP1 may be completed such that a stamping process is performed on the first working substrate WS1 to form the second electrode CE corresponding to the first sub-opening groove OP-S1 (refer to FIG. 8B), and a stamping process for removing the protection layer PIL and a laser process for removing the pixel defining layer PDL are performed to sequentially form a second sub-opening groove and a third sub-opening groove on the first sub-opening groove OP-S1 (refer to FIG. 8B).

In an embodiment, second and third opening grooves OP2 and OP3 are also formed through the same stamping process and laser process as those of the first opening groove OP1 and, herein, the stamping process and the laser process of the first opening groove OP1 will be described, and overlapping description for forming the second and third opening grooves OP2 and OP3 will be omitted.

Herein, referring to FIGS. 9A to 9E, a stamping process performed in FIG. 8C will be described in further detail.

Figure 9A:
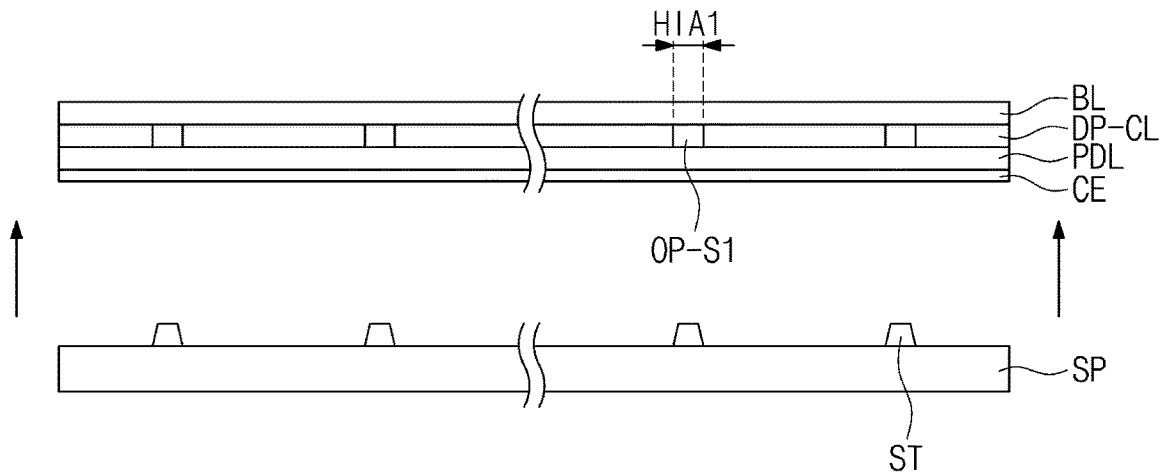
FIGS. 9A to 9E are cross-sectional views illustrating a stamping process in FIG. 8B.
Figure 10A:
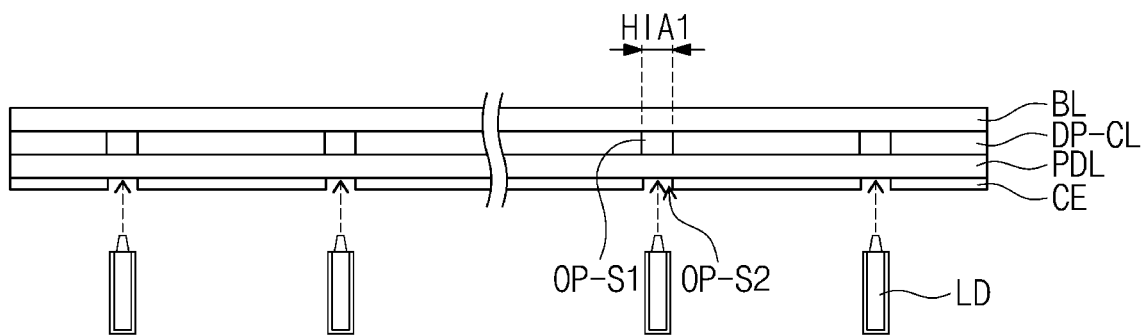
FIGS. 10A and 10B are cross-sectional views illustrating a laser process in FIG. 8C.
Figure 10B:
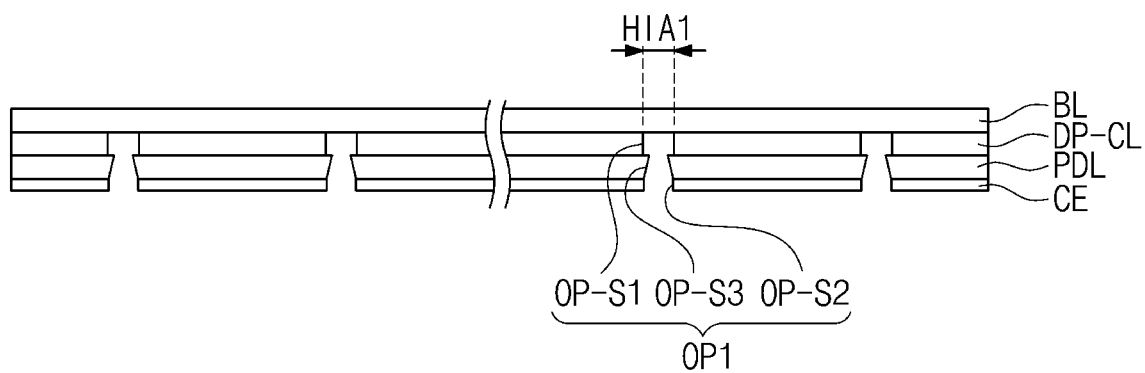

Referring to FIGS. 8C and 9A, the circuit element layer DP-CL and the display element layer OP-OLED are formed on the base layer BL. As illustrated in FIG. 8B, the first sub-opening groove OP-S1 is formed in the circuit element layer DP-CL in correspondence to the first hole area HIA1.

The display element layer OP-OLED is formed on the circuit element layer DP-CL. In FIG. 9A, for convenience of description, only the pixel defining layer PDL and the second electrode CE of the display element layer OP-OLED are illustrated. The protection layer PIL may be further formed above the second electrode CE.

The first working substrate WS1 in FIG. 9A may be disposed to face a stamping substrate SP of stamping equipment. At least one stamp ST is disposed on the stamping substrate SP. The first working substrate WS1 is disposed such that a top surface of the stamp ST faces a top surface of the display element layer DP-OLED. Particularly, the stamp ST may be disposed in correspondence to the first sub-opening groove OP-S1 of the cell area CR of the first working substrate WS1.

In an embodiment, the stamp ST is made of a rubber material having an adhesion property. In an embodiment, the stamp ST may be made of one of polydimethylsiloxane or silicon.

Figure 9B:
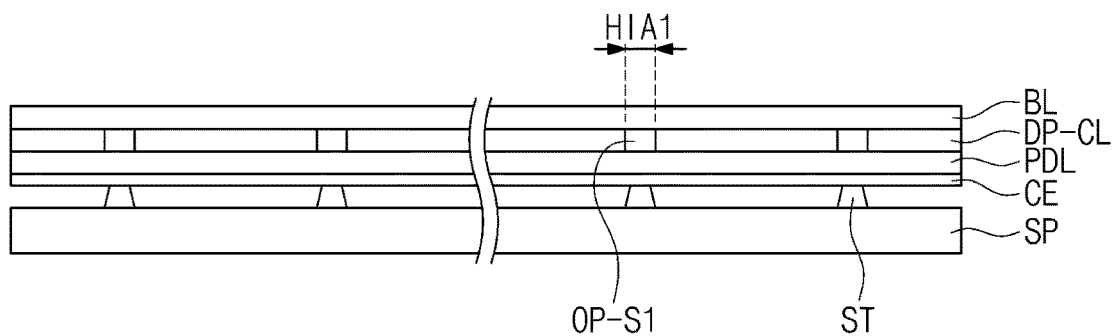
Figure 9C:
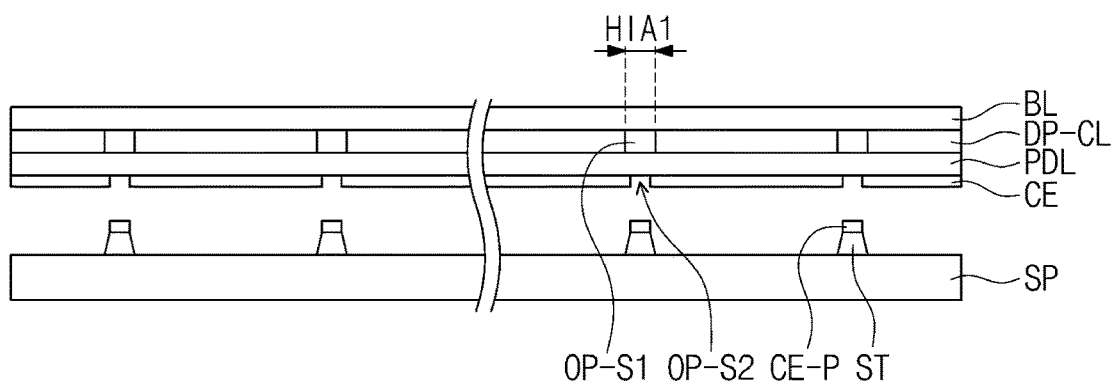

As illustrated in FIGS. 8C, 9B, and 9C, the stamping equipment moves the stamping substrate SP to attach/detach the top surface of the stamp ST to/from the top surface of the display element layer DP-OLED. Then, at least one inorganic layer of the display element layer EL-OLED may be delaminated in correspondence to the first hole area HIA1.

Since the second electrode CE is made of an inorganic material, and the pixel defining layer PDL is made of an organic material, an adhesion force between the second electrode CE and the pixel defining layer PDL is weak. Thus, when the stamping process is performed, a portion of the second electrode CE, which contacts the stamp ST, may be delaminated from the pixel defining layer PDL and attached to the top surface of the stamp ST. In an embodiment, for example, the stamp ST may have an adhesion force of about 300 gf/inch or more. However, exemplary embodiments of the inventive concept are not limited to the value of the adhesion force. For example, the adhesion force of the stamp ST may be higher than the adhesion force between the second electrode CE and the pixel defining layer PDL to delaminate the second electrode CE.

Here, a delaminated inorganic layer CE-P may be a portion of the second electrode CE. When the protection layer PIL (refer to FIG. 7) is further disposed on the second electrode CE, the delaminated inorganic layer CE-P may include a portion of the second electrode CE and a portion of the protection layer PIL.

As illustrated in FIG. 9C, after the stamping process, a second sub-opening groove OP-S2 may be defined above the first sub-opening groove OP-S1 in correspondence to the first hole area HIA1.

Figure 9D:
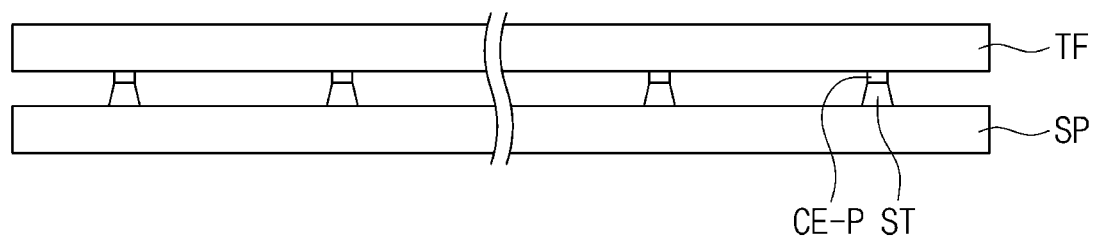
Figure 9E:
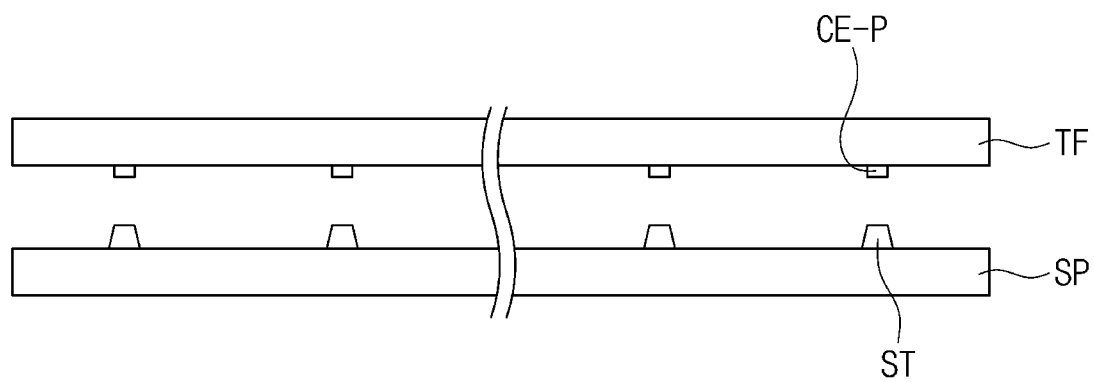

Referring to FIG. 9D, a transfer film TF is disposed on the stamping substrate SP in order to remove the delaminated inorganic layer CE-P attached to the top surface of the stamp ST. The transfer film TF may have an adhesion force higher than that of the stamp ST. The stamping substrate SP is moved to attach/detach the top surface of the stamp ST to/from the top surface of the transfer film TF. Since the transfer film TF has an adhesion force higher than that of the stamp ST, the inorganic layer CE-P attached to the top surface of the stamp is transferred to the transfer film TF.

The stamping substrate SP from which the delaminated inorganic layer CE-P is removed through the transfer process may continuously perform a process of removing an inorganic layer of another first working substrate WS1 that is provided for a follow-up process.

Also, when the second electrode CE and the protection layer PIL are removed in correspondence to the second and third hole areas HIA2 and HIA3 through the stamping process, third and fourth sub-opening grooves (not shown) may be formed in correspondence to the second and third hole areas HIA2 and HIA3 by performing the stamping process through the above-described process.

Herein, referring to FIGS. 10A and 10B, the laser process performed in FIG. 8C will be described in further detail.

Referring to FIG. 10A, a laser device LD is disposed in the first hole area HIA1 to face the first working substrate WS1 in which the first and second sub-opening grooves OP-S1 and OP-S2 in FIG. 9C are defined. The laser device LD irradiates a top surface of the pixel defining layer PDL, which is exposed by the second sub-opening groove OP-S2, with a laser.

The laser device LD may use at least one of a UV laser or a $CO_2$ laser. An intensity of a beam emitted from the laser device LD may be varied according to a thickness of the pixel defining layer PDL.

Although the pixel defining layer PDL is removed by the laser device LD in FIG. 10A, embodiments of the inventive concept are not limited thereto. For example, when the light emitting layer EML is further disposed in the first hole area HIA1, the light emitting layer EML also may be removed through the laser process.

As illustrated in FIG. 10B, when the laser process is completed, a third sub-opening groove OP-S3 is formed between the first and second sub-opening grooves OP-S1 and OP-S2. Accordingly, a first opening groove OP1 including the first to third sub-opening grooves OP-S1, OP-S2, and OP-S3 may be provided in the first hole area HIA1.

Referring to FIG. 8D again, in an embodiment, first to third opening grooves OP1, OP2, and OP3 are formed in each of the cell areas CR, and then the first working substrate WS1 is coupled to the second working substrate WS2. The sealing member SM is disposed on each of the cell areas CR. Herein, the first working substrate WS1 and the second working substrate WS2, which are coupled to each other, are defined as a working panel WP.

Thereafter, the working panel WP is separated for each cell area CR. In an embodiment, the working panel WP is cut along a first cutting line CL1-1 and a second cutting line CL1-2 by using a cutting wheel CH. A cut cell stick may be cut again along a third cutting line CL2-1 and a fourth cutting line CL2-2.

In an embodiment, the display panel DP described with reference to FIGS. 1 to 7 may be formed by polishing side surfaces of pieces (preliminary display panels) of the cut working panel WP.

Figure 11:
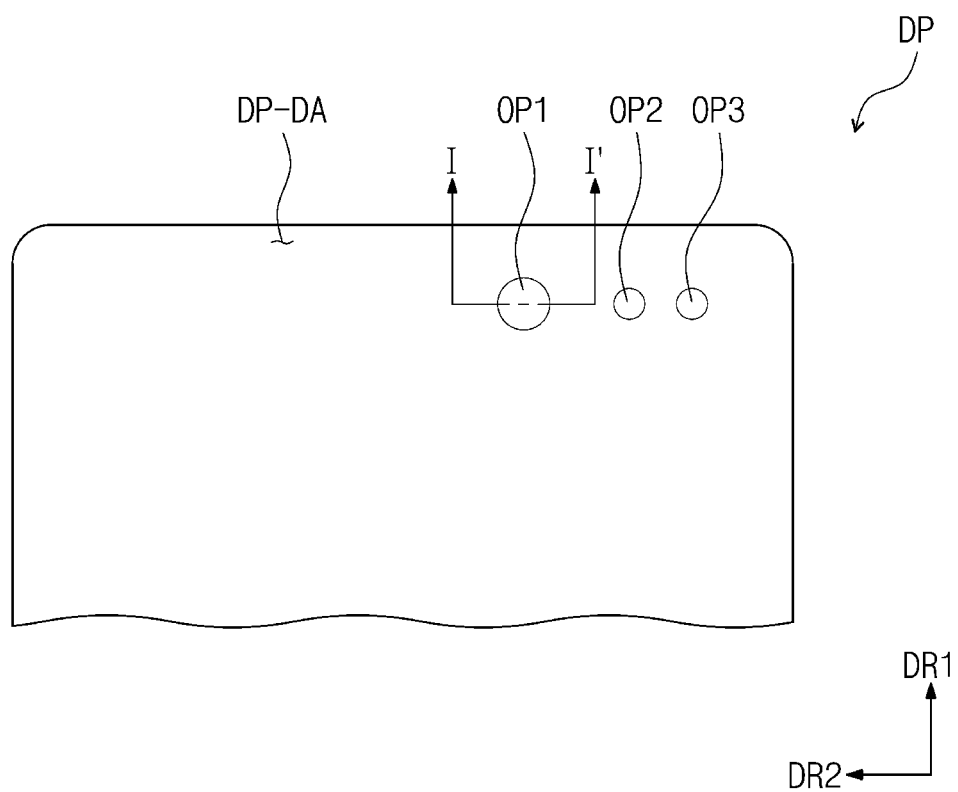
FIG. 11 is a partial plan view illustrating the display panel according to an exemplary embodiment of the inventive concept.
Figure 12A:
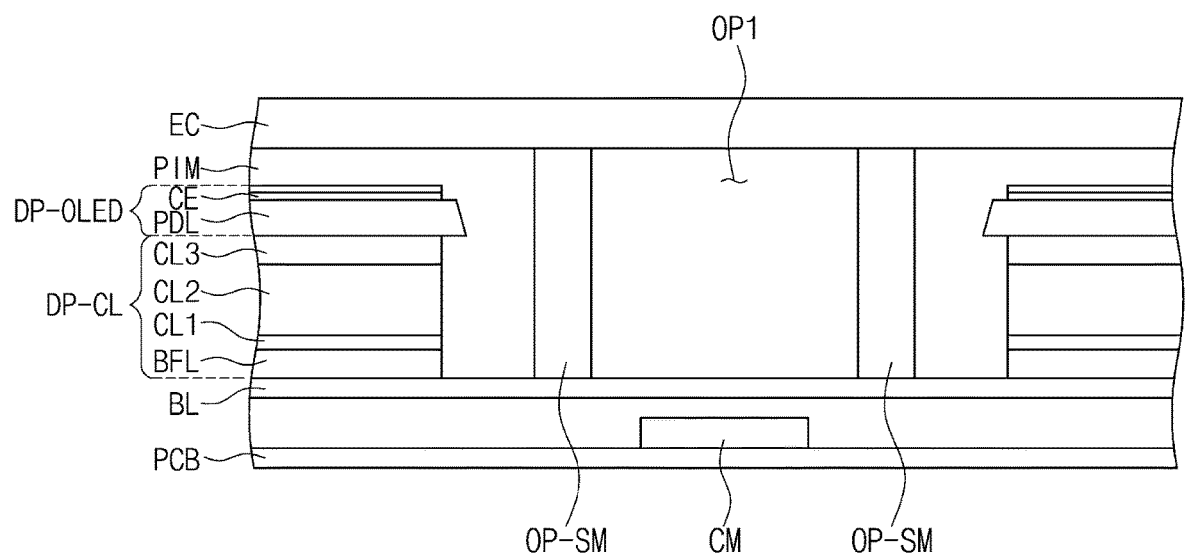
FIG. 12A is a cross-sectional view taken along the line I-I' of FIG. 11.

FIG. 11 is a plan view illustrating a portion of a display panel according to an exemplary embodiment of the inventive concept; and FIG. 12A is a cross-sectional view taken along the line I-I' of FIG. 11.

Referring to FIGS. 11 and 12A, first to third opening grooves OP1, OP2, and OP3 are formed in the display area DP-DA of the display panel DP manufactured through the processes in FIGS. 8A to 10B.

Figure 8D:
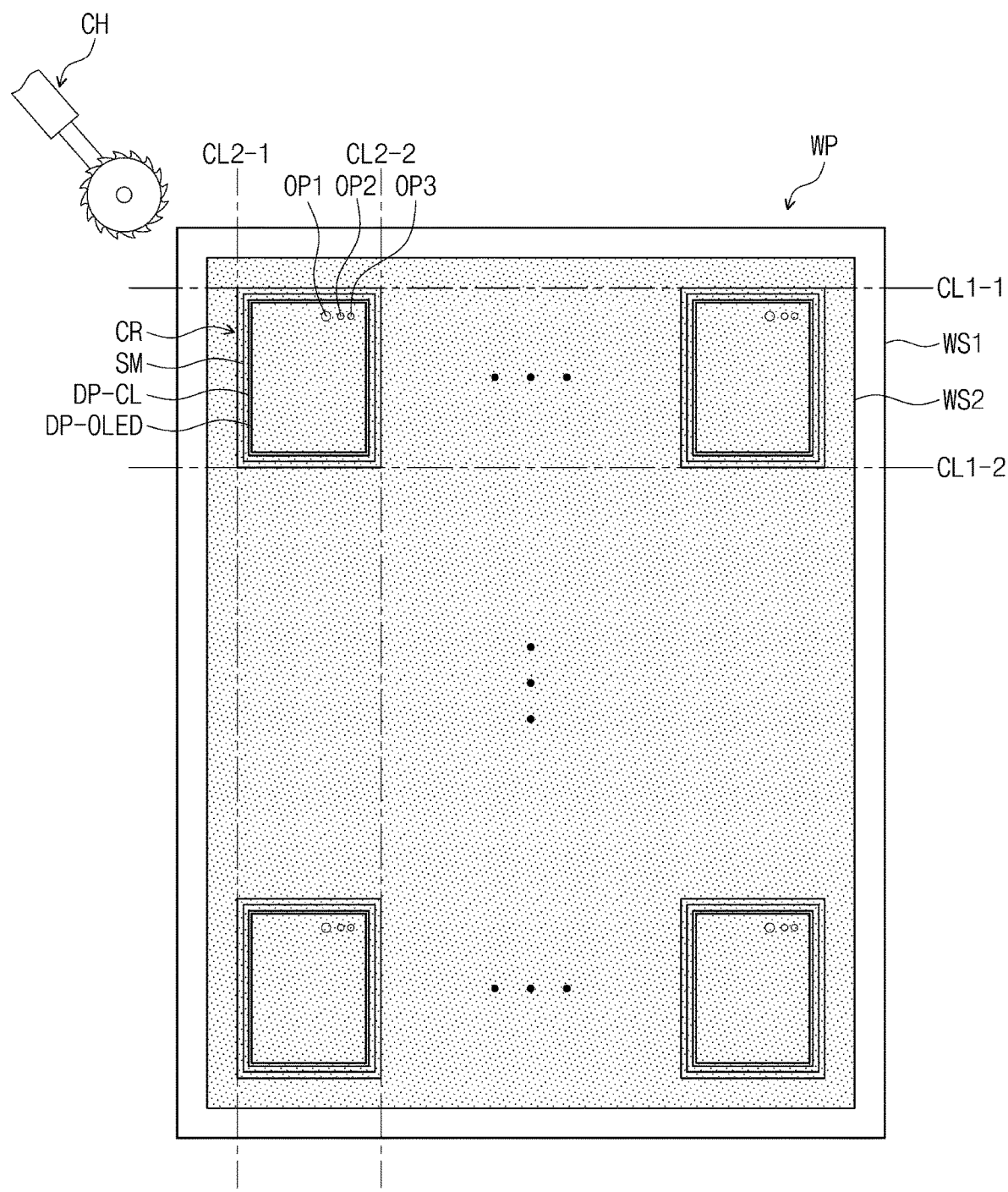

In conjunction with the sealing member SM provided for each cell area to couple the first working substrate WS1 to the second working substrate WS2 in FIG. 8D, a groove sealing member OP-SM may be further provided in an area in which the first opening groove OP1 is defined, as illustrated in FIG. 12A. As the inner walls of the circuit element layer DP-CL and the display element layer DP-OLED, which are exposed through the first opening groove OP1, are sealed, the groove sealing member OP-SM may prevent or substantially prevent external pollutants from being introduced into the circuit element layer DP-CL and the display element layer DP-OLED. In an embodiment, an air layer may be formed in the first opening groove OP1 that is sealed by the groove sealing member OP-SM.

The encapsulation substrate EC is coupled to the base layer BL by the sealing member SM (refer to FIG. 8D). As the encapsulation substrate EC is not opened in correspondence to the first opening groove OP1, the first opening groove OP1 may be sealed by the groove sealing member OP-SM and the encapsulation substrate EC and thus further firmly protected from external moisture.

A circuit board PCB to which the camera module CM is mounted may be disposed below the display panel DP. The camera module CM is disposed at a position corresponding to the first opening groove OP1. Accordingly, external light may be received through the first opening groove OP1. As layers that decrease a light transmittance in an area corresponding to the first opening groove OP1 are removed, operation reliability of the camera module CM is enhanced.

Although not shown in the drawings, as the second and third opening grooves OP2 and OP3 are defined, areas corresponding to the second and third opening grooves OP2 and OP3 may increase in light transmittance, and, thus, overall operation reliability of the electronic optical module ELM may be enhanced.

Figure 12B:
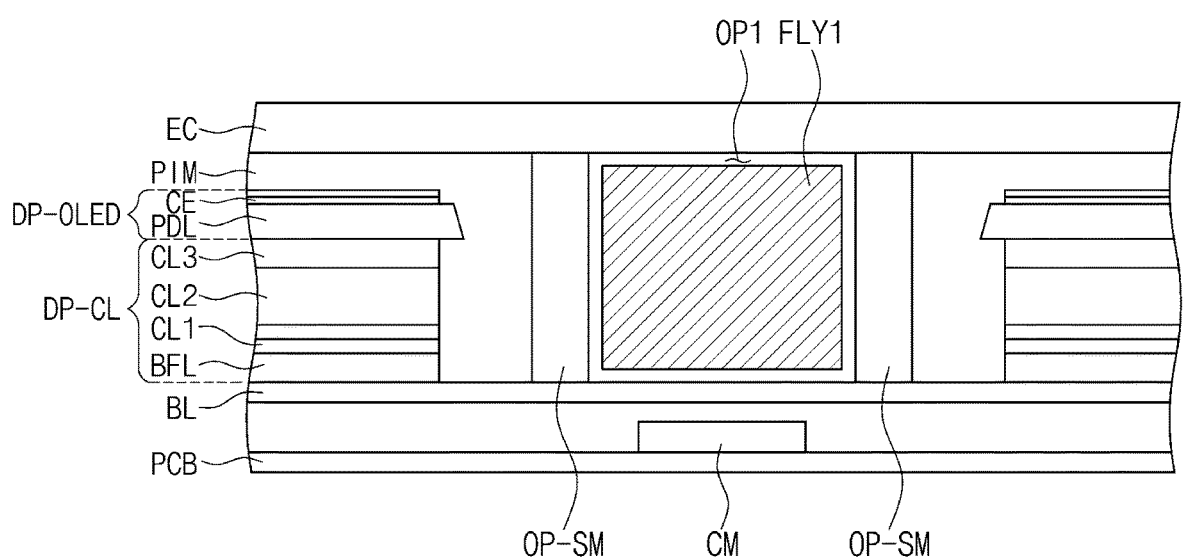
FIG. 12B is a partial cross-sectional view illustrating a display panel according to an exemplary embodiment of the inventive concept.

FIG. 12B is a partial cross-sectional view illustrating the display panel according to an exemplary embodiment of the inventive concept.

Referring to FIG. 12B, in an embodiment, a first filling layer FLY1 may be further disposed in the first opening groove OP1 sealed by the groove sealing member OP-SM. The first filling layer FLY1 may be a resin layer made of an organic material and filled in the first opening groove OP1. In an embodiment, the first filling layer FLY1 may have a light transmittance of about 90% or more.

In an embodiment of the inventive concept, the first filling layer FLY1 may have a refractive index of about 1.4 to about 1.6. In an embodiment, the first filling layer FLY1 may be made of a material having a same (same or substantially same) refractive index as one of the base layer BL and the encapsulation substrate EC. Here, the refractive index of the first filling layer FLY1 may have an difference of about 5% in comparison with a refractive index of one of the base layer BL and the encapsulation substrate EC.

Figure 13:
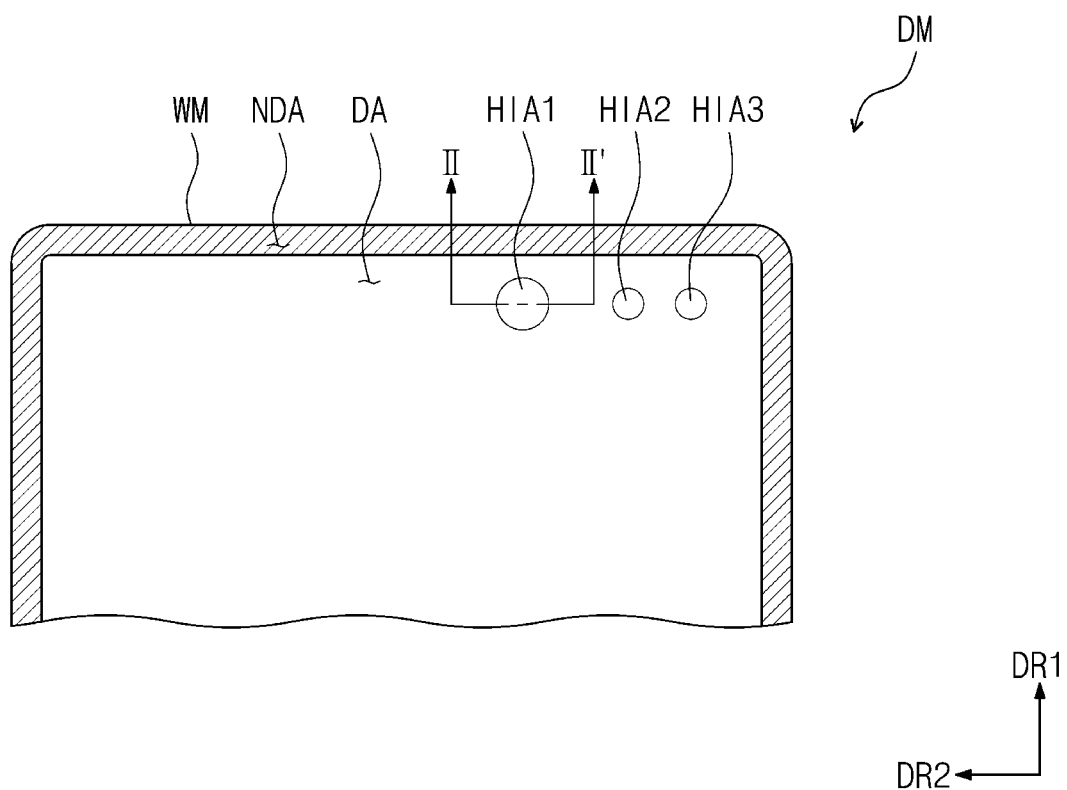
FIG. 13 is a partial plan view illustrating a display module according to an exemplary embodiment of the inventive concept.
Figure 14A:
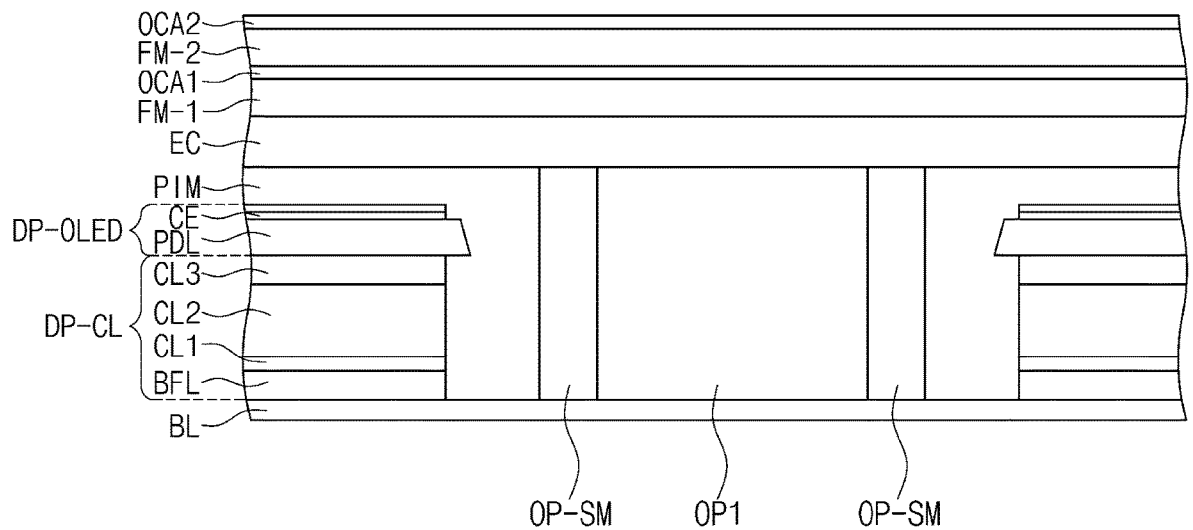
FIGS. 14A to 14C are cross-sectional views illustrating a process of manufacturing a portion taken along the line II-II' in FIG. 13.
Figure 14B:
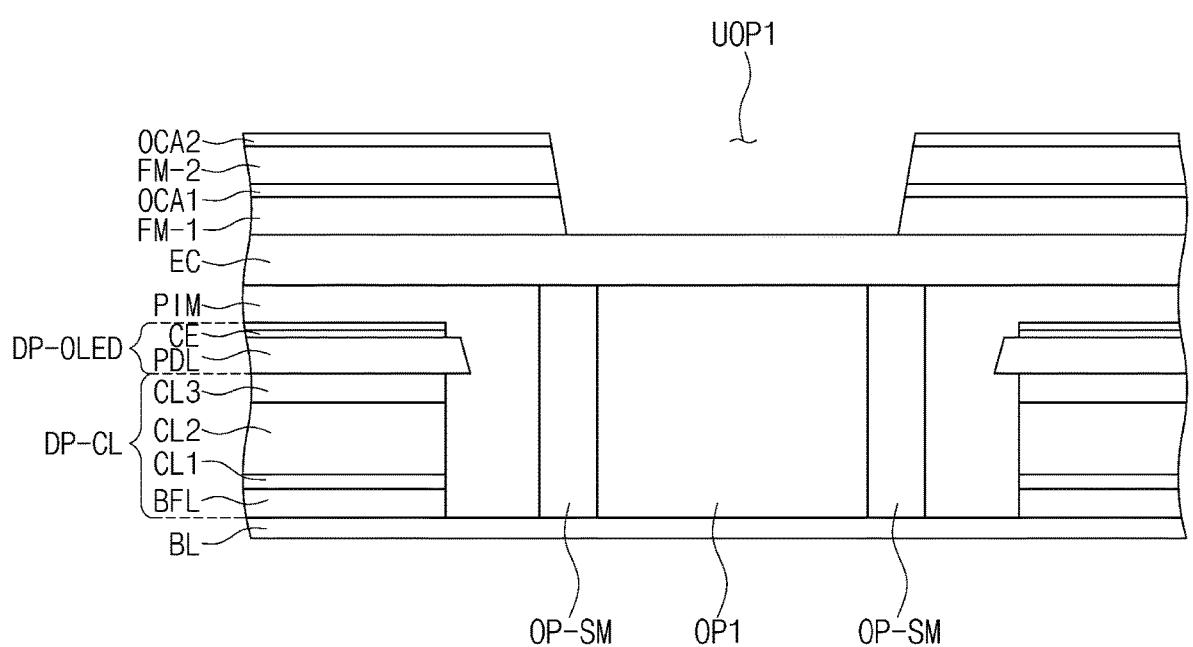
Figure 14C:
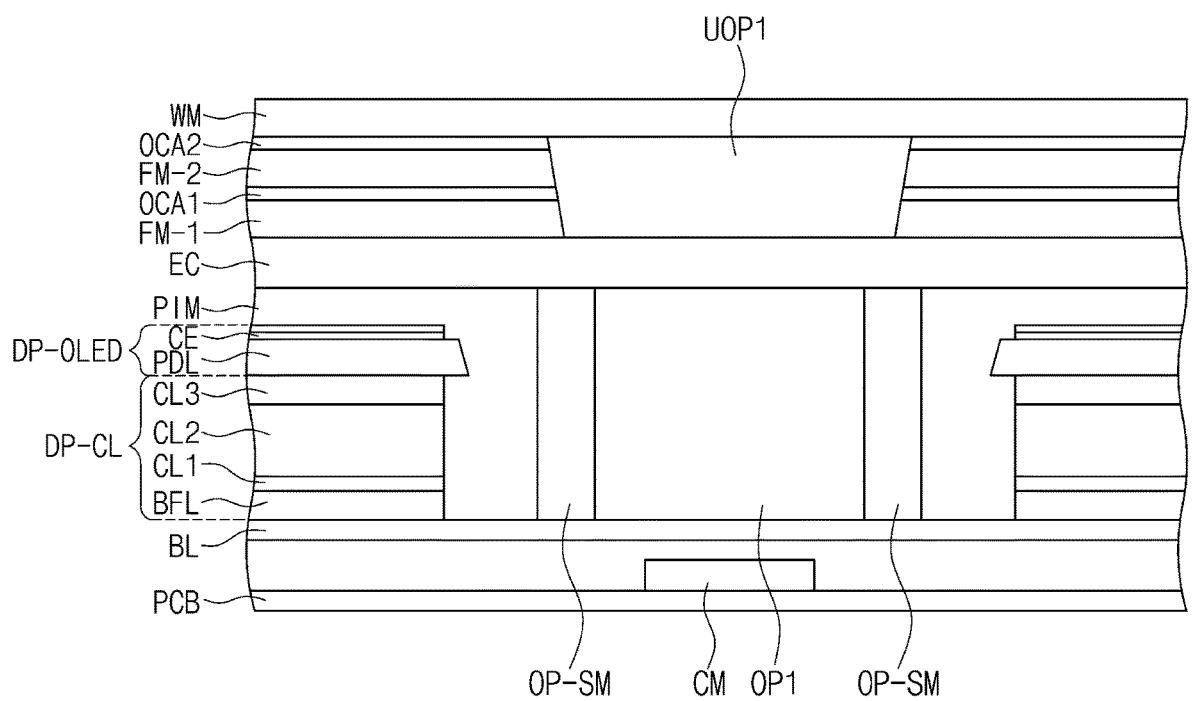

FIG. 13 is a partial plan view illustrating the display module according to an exemplary embodiment of the inventive concept; and FIGS. 14A to 14C are cross-sectional views illustrating a process of manufacturing a portion taken along the line II-II' in FIG. 13.

Referring to FIG. 13, a display module DM includes a display area DA and a non-display area NDA. First to third hole areas HIA1, HIA2, and HIA3 are defined in the display area DA. The first to third hole areas HIA1, HIA2, and HIA3 correspond to the first to third opening grooves OP1, OP2, and OP3 in FIG. 11, respectively.

Referring to FIG. 14A, a first functional layer (such as corresponding to the input sensing unit FM-1 in FIG. 2), a first adhesion layer OCA1, a second functional layer (such as corresponding to the reflection preventing unit FM-2 in FIG. 2), and a second adhesion layer OCA2 may be sequentially laminated on the encapsulation substrate EC of the display panel DP.

Referring to FIG. 14B, a first upper opening groove UOP1 may be further formed above the first opening groove OP1 through a removal process of removing the first functional layer FM-1, the first adhesion layer OCA1, the second functional layer FM-2, and the second adhesion layer OCA2. Although two functional layers and two adhesion layers are shown disposed on the display panel in an embodiment of the inventive concept, embodiments of the inventive concept are not limited thereto. In an embodiment, for example, one functional layer and one adhesion layer may be disposed on the display panel DP.

Although not shown in the drawings, through the removal process, second and third upper opening grooves may be further formed above the second and third opening grooves OP2 and OP3 (refer to FIG. 11). As an exemplary embodiment of the inventive concept, the removal process may be a laser process.

As illustrated in FIG. 14C, the window WM may be coupled to the second functional layer FM-2 by the second adhesion layer OCA2. As the window WM is not opened in correspondence to the first upper opening groove UOP1, the first upper opening groove UOP1 may be sealed by the window WM.

The camera module CM is disposed at a position corresponding to the first upper opening groove UOP1. Accordingly, external light may be received through the first upper opening groove UOP1 and the first opening groove OP1. As layers that decrease a light transmittance in an area corresponding to the first opening groove OP1 are removed, the operation reliability of the camera module CM is enhanced.

Although not shown in the drawings, as the second and third upper opening groove are defined in the first and second functional layers FM-1 and FM-2 and the first and second adhesion layers OCA1 and OCA2, an area corresponding to the second and third upper opening grooves may increase in light transmittance, and, thus, the overall operation reliability of the electronic optical module ELM may be enhanced.

Figure 15A:
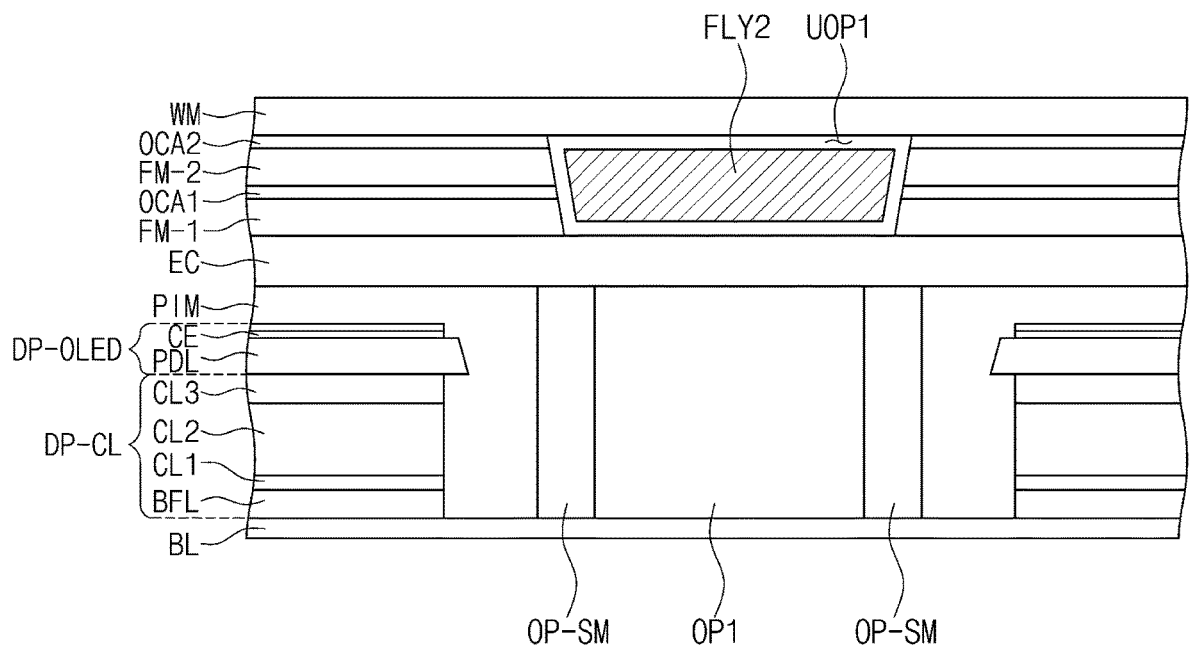
FIG. 15A is a partial cross-sectional view illustrating a display module according to an exemplary embodiment of the inventive concept.
Figure 15B:
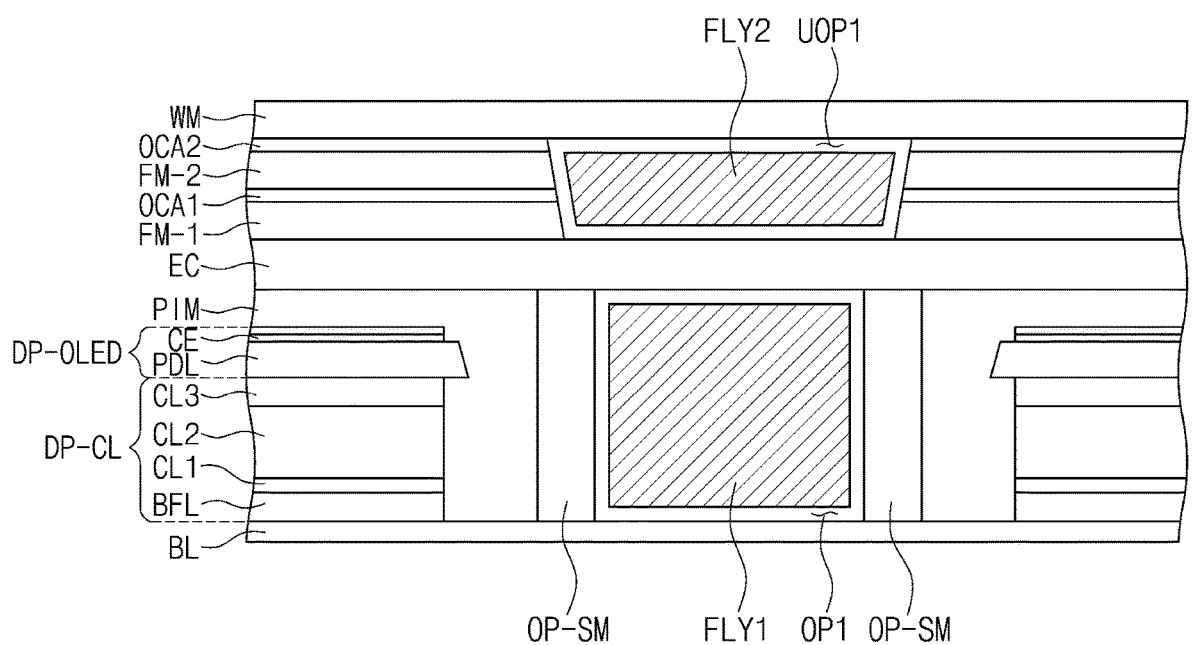
FIG. 15B is a partial cross-sectional view illustrating a display module according to an exemplary embodiment of the inventive concept.

FIG. 15A is a partial cross-sectional view illustrating a display module according to an exemplary embodiment of the inventive concept; and FIG. 15B is a partial cross-sectional view illustrating a display module according to an embodiment of the inventive concept.

Referring to FIG. 15A, a display module according to an embodiment of the inventive concept may further include a second filling layer FLY2 that is filled in the first upper opening groove UOP1 sealed by the window WM. In an embodiment, the second filling layer FLY2 may be a resin layer made of an organic material and filled in the first upper opening groove UOP1. In an embodiment, the second filling layer FLY2 may have a light transmittance of about 90% or more.

In an embodiment of the inventive concept, the second filling layer FLY2 may have a refractive index of about 1.4 to about 1.6. In an embodiment, the second filling layer FLY2 may be made of a material having the same (same or substantially same) refractive index as one of the encapsulation substrate EC and the window WM. Here, the refractive index of the second filling layer FLY2 may have a difference of about 5% in comparison with a refractive index of one of the encapsulation substrate EC and the window WM.

The second filling layer FLY2 may be formed by being filled into the first upper opening groove UOP1 before the window WM is attached to the second functional layer FM-2 by the second adhesion layer OCA2.

Although not shown in the drawings, third and fourth filling layers may be additionally formed in the second and third upper opening grooves.

Referring to FIG. 15B, a display module according to an embodiment of the inventive concept may include a first filling layer FLY1 filled in the first opening groove OP1 and a second filling layer FLY2 filled in the first upper opening groove UOP1.

In an embodiment, each of the first and second filling layers FLY1 and FLY2 may be a resin layer made of an organic material, and the first and second filling layers FLY1 and FLY2 may have the same (same or substantially same) refractive index as each other or different refractive indexes from each other. In an embodiment, the first filling layer FLY1 may be made of a material having the same (same or substantially same) refractive index as one of the base layer and the encapsulation substrate EC, and the second filling layer FLY2 may be made of a material having the same (same or substantially same) refractive index as one of the encapsulation substrate EC and the window WM.

Figure 16:
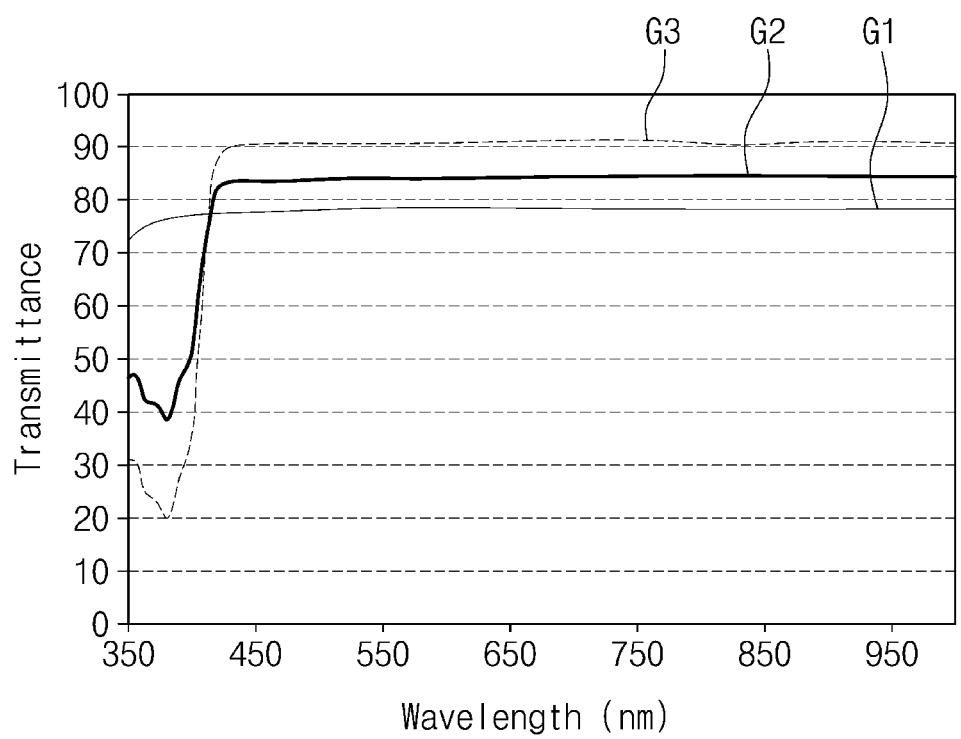
FIG. 16 is a graph showing transmittances of the embodiments in FIGS. 14C, 15A, and 15B for a wavelength band.

FIG. 16 is a graph showing transmittances of the embodiments in FIGS. 14C, 15A, and 15B over a wavelength band.

In FIG. 16, a first graph line G1 shows a transmittance over a wavelength band in the first hole area HIA1 of the display module according to a first embodiment excluding the first and second filling layers FLY1 and FLY2 as illustrated in FIG. 14C, a second graph line G2 shows a transmittance over a wavelength band in the first hole area HIA1 of the display module according to a second embodiment including the second filling layers FLY2 as illustrated in FIG. 15A, and a third graph line G3 shows a transmittance over a wavelength band in the first hole area HIA1 of the display module according to a third embodiment including the first and second filling layers FLY1 and FLY2 as illustrated in FIG. 15B.

In Table 1 below, results obtained by measuring transmittances for first to third embodiments at a specific wavelength are shown. In Table 1, a wavelength of about 455 nm indicates a representative wavelength value of a blue wavelength band, a wavelength of about 525 nm represents a representative wavelength value of a green wavelength band, a wavelength of about 620 nm indicates a representative wavelength value of a red wavelength band. Also, a wavelength of about 940 nm indicates a representative wavelength value of an infrared wavelength band.

TABLE 1

|  | 455 nm | 525 nm | 620 nm | 780 nm | 940 nm |
| --- | --- | --- | --- | --- | --- |
| First embodiment | 77.88 | 78.39 | 78.57 | 78.12 | 78.23 |
| Second embodiment | 83.62 | 84.06 | 84.21 | 84.35 | 84.30 |
| Third embodiment | 90.41 | 90.79 | 90.92 | 90.92 | 90.69 |

Referring to Table 1 and FIG. 16, the display module according to the first embodiment has a transmittance of about 80% or less at the first hole area HIA1 in all of the red, green, and blue wavelength bands. That is, when the first and second filling layers FLY1 and FLY2 are not provided, the transmittance at the first hole area HIA1 is about 80% or less in all wavelength bands.

However, the display module according to the second embodiment has a transmittance of about 80% or more at the first hole area HIA1 in the red, green, and blue wavelength bands. Specifically, the display module according to the second embodiment has a transmittance of about 84% or more except for that in the blue wavelength band.

Also, when both of the first and second filling layers FLY1 and FLY2 are provided like the display module according to the third embodiment, a transmittance at the first hole area HIA1 in the infrared wavelength band, as well as the red, green, and blue wavelength bands, is about 90% or more.

As described above, when at least one of the first and second filling layers FLY1 and FLY2 is disposed in the first to third hole areas HIA1 to HIA3 of the display module, the transmittance may increase, and, as a result, the overall operation reliability of the electronic optical module ELM may be enhanced.

Figure 17:
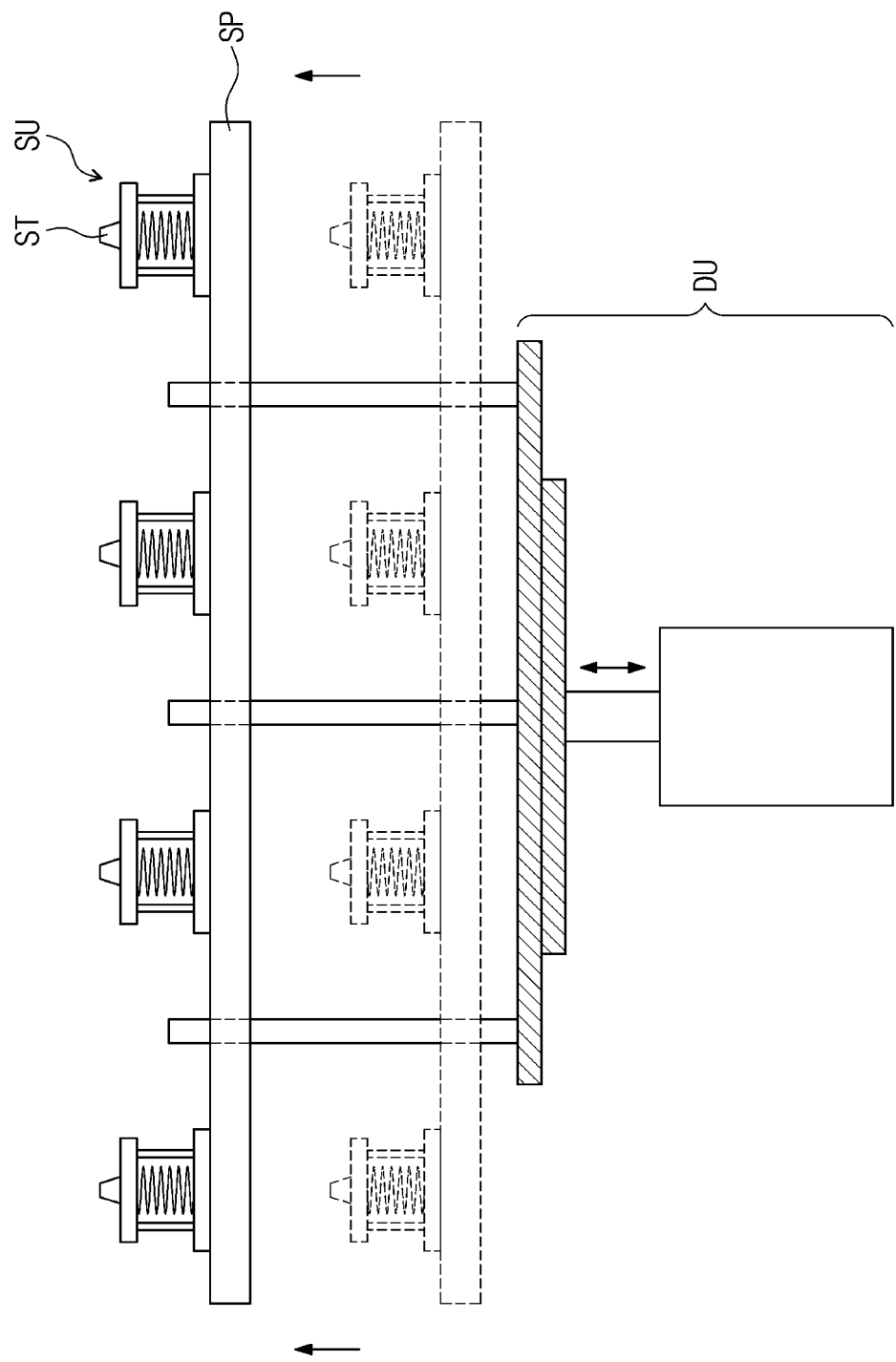
FIG. 17 is a conceptual view illustrating stamping equipment according to an exemplary embodiment of the inventive concept.
Figure 18:
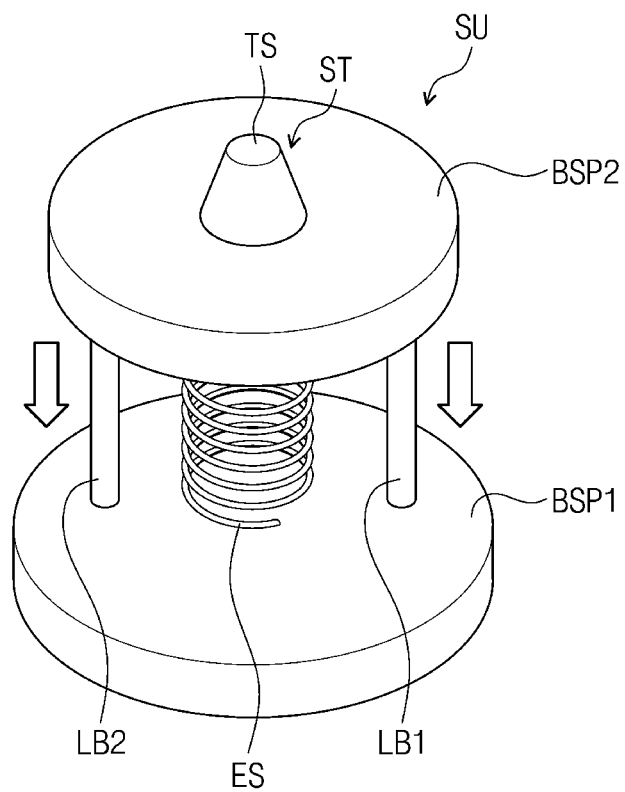
FIG. 18 is a perspective view illustrating a stamper unit in FIG. 17.
Figure 19A:
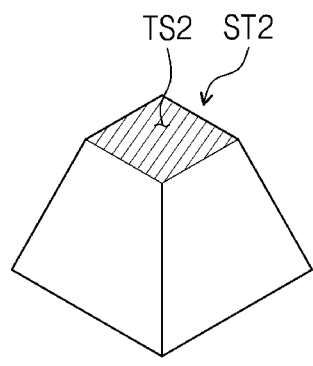
FIGS. 19A and 19B are perspective views each illustrating a stamper according to an exemplary embodiment of the inventive concept.
Figure 19B:
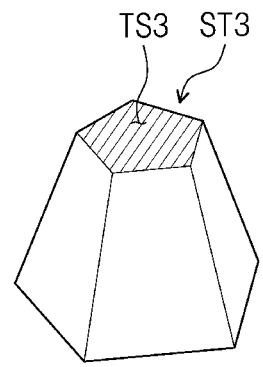

FIG. 17 is a conceptual view illustrating stamping equipment according to an exemplary embodiment of the inventive concept; FIG. 18 is a perspective view illustrating a stamper unit in FIG. 17; and FIGS. 19A and 19B are perspective views illustrating a stamper according to exemplary embodiments of the inventive concept.

Referring to FIG. 17, the stamping equipment includes a stamping substrate SP, a plurality of stamping units SU mounted to the stamping substrate SP, and a movement unit DU for vertically moving the stamping substrate SP.

Although the stamping substrate SP may be a plate made of a metallic material, exemplary embodiments of the inventive concept are not limited to the material and shape of the stamping substrate SP.

The plurality of stamping units SU may be mounted to the stamping substrate SP. The number of stamping units SU may be set according to the number of the cell areas CR (refer to FIGS. 8A to 8D) of the first working substrate WS1 (refer to FIGS. 8A to 8D). For example, when a stamping process is performed on the first working substrate WS1 on which 40 cell areas CR are provided, the number of the stamping units SU may be one of 10, 20, or 40. When 10 stamping units SU are disposed, in order to form the second sub-opening groove OP-S2 (refer to FIG. 9C) in all of the cell areas CR of the first working substrate WS1, the stamping equipment performs the stamping process four times.

When 20 stamping units SU are disposed, in order to form the second sub-opening groove OP-S2 in all of the cell areas CR of the first working substrate WS1, the stamping equipment performs the stamping process two times.

However, when 40 stamping units SU are disposed, the stamping equipment may perform the stamping process one time to form the second sub-opening groove OP-S2 in all of the cell areas CR of the first working substrate WS1. Accordingly, as an embodiment of the inventive concept, the number of the stamping units SU may correspond to the number of the cell areas CR of the first working substrate WS1 in order to reduce the number of processes.

Referring to FIGS. 17 and 18, in an embodiment, the stamping unit SU may include a first base plate BSP1, a second base plate BSP2, a stamp ST, a guide member LB1 and LB2, and an elastic member ES.

The first base plate BSP1 is coupled to the stamping substrate SP to fix the stamping unit SU to the stamping substrate SP. The second base plate BSP2 is disposed parallel to the first base plate BSP1 while being spaced a distance (e.g., a predetermined distance) from the first base plate BSP1. The stamp ST is disposed on a top surface of the second base plate BSP2.

In an embodiment, the stamp ST may be made of a rubber material having an adhesion property. As an embodiment of the inventive concept, the stamp ST is made of one of polydimethylsiloxane or silicon. In an embodiment, the stamp ST may have an adhesion force of about 300 gf/inch or more.

The stamp ST may be fixed to the second base plate BSP2 through a separate fixing member (not shown). In an embodiment, the stamp ST is fixed to the second base plate BSP2 in a detachable manner, and the stamp ST may be easily replaced when the adhesion force of the stamp ST is weak.

The first and second base plates BSP1 and BSP2 are connected through the guide member LB1 and LB2. When the first and second base plates BSP1 and BSP2 receive an external force, the second base plate BSP2 may move toward the first base plate BSP1 along the guide member LB1 and LB2. As an embodiment of the inventive concept, although the guide member LB1 and LB2 is shown including two guide bars in FIG. 18, embodiments of the inventive concept are not limited to the number of the guide bars.

Also, the elastic member ES is disposed between the first and second base plate BSP1 and BSP2. When a force is applied to the first and second base plates BSP1 and BSP2, the elastic member ES may be contracted by elasticity, and a restoration force of the elastic member ES may be transmitted to the stamp ST disposed on the second base plate BSP2, such that the stamp ST closely contacts the second electrode CE (refer to FIG. 9B) of the first working substrate WS1.

Although the stamp ST is shown having a cone shape in which each of a top surface TS and a bottom surface of the stamp ST has a circular shape and the top surface TS has a diameter less than that of the bottom surface in FIG. 18, embodiments of the inventive concept are not limited to the shape of the stamp ST.

As illustrated in FIG. 19A, a stamp ST2 according to another embodiment of the inventive concept may have a rectangular cylinder shape in which each of a top surface TS2 and a bottom surface has a small rectangular shape, and the top surface TS2 has an area less than that of the bottom surface. In another embodiment, as illustrated in FIG. 19B, a stamp ST3 may have a small pentagonal cylinder shape in which each of a top surface TS3 and a bottom surface has a pentagonal shape, and the top surface TS3 has an area less than that of the bottom surface.

As described above, when the display panel having the wide display area and the narrow non-display area is manufactured, the failure rate in the manufacturing process may be reduced by forming the opening groove on the display area through the stamping process.

The above-described embodiments are to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

Hence, the real scope of the inventive concept shall be determined by the technical scope of the accompanying claims.

What is claimed is:

1. A method for manufacturing a display panel, the method comprising:
   forming a circuit element layer comprising a transistor on a plurality of cell areas of a first working substrate, wherein each of the cell areas comprises a hole area on which at least one first sub-opening groove on which the circuit element layer is not formed is located;
   forming a display element layer comprising a light emitting element on the plurality of cell areas;
   removing at least one inorganic layer of the display element layer formed in the first sub-opening groove by stamping to define a second sub-opening groove, wherein the at least one inorganic layer of the display element layer formed in the first sub-opening groove is removed from an upper surface of an organic layer of the display element layer so as to expose the upper surface of the organic layer;
   coupling the first working substrate to a second working substrate to define a working panel; and
   cutting the working panel into portions corresponding to the plurality of cell areas.

2. The method of claim 1, wherein the at least one inorganic layer comprises an electrode arranged on a light emitting layer of the light emitting element.

3. The method of claim 2, wherein the light emitting element comprises a light emitting diode, and the electrode is a cathode electrode of the light emitting diode.

4. The method of claim 1, further comprising forming a protection layer on the display element layer before the removing of the at least one inorganic layer.

5. The method of claim 4, wherein the removing of the at least one inorganic layer comprises removing the at least one inorganic layer and the protection layer concurrently by the stamping.

6. The method of claim 1, wherein the removing of the at least one inorganic layer comprises:
   providing stamping equipment in which at least one stamp is arranged in correspondence to each of the plurality of cell areas;
   arranging the first working substrate such that a top surface of the at least one stamp faces a top surface of the display element layer;
   attaching and then detaching the top surface of the at least one stamp to or from the top surface of the display element layer by using the stamping equipment to delaminate the at least one inorganic layer of the display element layer in correspondence to the first sub-opening groove to define the second sub-opening groove; and
   transferring the delaminated inorganic layer attached to the top surface of the at least one stamp to a transfer film.

7. The method of claim 6, wherein the at least one stamp is made of a rubber material having an adhesion property.

8. The method of claim 7, wherein the at least one stamp is made of polydimethylsiloxane or silicon.

9. The method of claim 7, wherein the at least one stamp has an adhesion force of about 300 gf/inch or more.

10. The method of claim 7, wherein the transfer film has an adhesion force greater than that of the at least one stamp.

11. The method of claim 6, wherein a number of stamps of the at least one stamp of the stamping equipment is equal to or less than that of the plurality of cell areas of the first working substrate.

12. The method of claim 1, further comprising irradiating the hole area with a laser to remove the organic layer exposed by the second sub-opening groove to define a third sub-opening groove after the removing of the at least one inorganic layer.

13. The method of claim 1, wherein each of the plurality of cell areas comprises a display area on which a plurality of pixels is located and a bezel area around the display area, and
   the hole area is located in the display area.

14. The method of claim 13, further comprising forming a filling layer in the hole area of the first working substrate before the coupling of the first working substrate to the second working substrate.

15. The method of claim 14, wherein the filling layer has a same refractive index as one of the first working substrate and the second working substrate.

16. The method of claim 1, further comprising:
   forming a functional layer on the display panel;
   forming an adhesion layer on the functional layer; and
   forming a window on the adhesion layer.

17. The method of claim 16, further comprising forming an upper opening groove by removing the functional layer and the adhesion layer in correspondence to the hole area before the forming of the window.

18. The method of claim 17, further comprising forming a second filling layer in the upper opening groove before the forming of the window.

19. The method of claim 18, wherein the second filling layer has a same refractive index as one of the window and the second working substrate.

20. The method of claim 1, further comprising forming a sealing member configured to seal each of the plurality of cell areas before the coupling of the first working substrate to the second working substrate.

21. The method of claim 20, wherein each of the plurality of cell areas comprises a display area on which a plurality of pixels is located and a bezel area around the display area, and
   the sealing member is located in the bezel area.

22. The method of claim 20, wherein the hole area is located in the display area, and
   the forming of the sealing member further comprises forming a hole sealing member at a boundary of the hole area.

* * * * *